(12) United States Patent
Lee et al.

(10) Patent No.: US 12,446,419 B2
(45) Date of Patent: Oct. 14, 2025

(54) DISPLAY DEVICE AND METHOD OF PROVIDING THE SAME

(71) Applicant: Samsung Display Co., LTD., Yongin-si (KR)

(72) Inventors: Sangduk Lee, Yongin-si (KR); Misun Kim, Hwaseong-si (KR); Kikyung Youk, Yongin-si (KR); Seung-Yeon Chae, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 571 days.

(21) Appl. No.: 17/839,910

(22) Filed: Jun. 14, 2022

(65) Prior Publication Data

US 2023/0051284 A1    Feb. 16, 2023

(30) Foreign Application Priority Data

Aug. 12, 2021    (KR) .................. 10-2021-0106515

(51) Int. Cl.
*H10K 59/131*  (2023.01)
*H10K 59/12*   (2023.01)
*H10K 71/00*   (2023.01)
*H10K 77/10*   (2023.01)
*H10K 102/00*  (2023.01)

(52) U.S. Cl.
CPC .......... *H10K 59/131* (2023.02); *H10K 71/00* (2023.02); *H10K 77/111* (2023.02); *H10K 59/1201* (2023.02); *H10K 2102/311* (2023.02)

(58) Field of Classification Search
CPC .... H10K 59/131; H10K 71/00; H10K 77/111; H10K 59/1201; H10K 2102/311; H10K 59/127
See application file for complete search history.

(56) References Cited

U.S. PATENT DOCUMENTS

| | | |
|---|---|---|
| 6,176,953 B1 | 1/2001 | Landreth et al. |
| 2016/0172623 A1* | 6/2016 | Lee ............ B32B 5/18 257/40 |
| 2019/0165332 A1* | 5/2019 | Kwon .......... G09G 3/3208 |
| 2019/0198476 A1 | 6/2019 | Kim et al. |
| 2019/0333978 A1 | 10/2019 | Lee |

(Continued)

FOREIGN PATENT DOCUMENTS

| | | |
|---|---|---|
| CN | 112086374 A | 12/2020 |
| KR | 20080029279 A | 4/2008 |
| KR | 1020140064166 A | 5/2014 |

(Continued)

OTHER PUBLICATIONS

Korean Office Action for Korean Patent Application No. 10-2021-0106515 dated Aug. 14, 2025.

*Primary Examiner* — Julia Slutsker
(74) *Attorney, Agent, or Firm* — CANTOR COLBURN LLP

(57) ABSTRACT

A display device includes a substrate including a display area and a pad area which is adjacent to the display area, a display part in the display area, on the substrate, a protective layer under the substrate and defining a first opening overlapping the pad area, a rigid support member filling the first opening of the protective layer and including glass, and a driving circuit chip in the pad area, on the substrate.

7 Claims, 20 Drawing Sheets

(56) References Cited

U.S. PATENT DOCUMENTS

2020/0358014 A1   11/2020   Park et al.

FOREIGN PATENT DOCUMENTS

| KR | 1020190071026 A | 6/2019 |
| KR | 20190079728 A | 7/2019 |
| KR | 20190124839 A | 11/2019 |
| KR | 20200129230 A | 11/2020 |

* cited by examiner

DISPLAY DEVICE AND METHOD OF PROVIDING THE SAME

This application claims priority to Korean Patent Application No. 10-2021-0106515, filed on Aug. 12, 2021, and all the benefits accruing therefrom under 35 U.S.C. § 119, the content of which is hereby incorporated by reference for all purposes as if fully set forth herein.

BACKGROUND

1. Field

Embodiments relate to a display device and method of providing (or manufacturing) the same. More particularly, embodiments relate to a flexible display device and method of providing (or manufacturing) the same.

2. Description of the Related Art

Flat panel display devices are replacing cathode ray tube display devices as display devices due to their lightweight and thin characteristics. As representative examples of such flat panel display devices, there are liquid crystal display devices and organic light emitting diode display devices.

At least a portion of the display device may be bendable, foldable or rollable. Therefore, visibility of the display device from various angles may be improved, and an area of a non-display region may be decreased. In a method of providing (or manufacturing) the display device in which at least a portion thereof is bendable, foldable or rollable, methods for minimizing or reducing damage and manufacturing cost have been studied.

SUMMARY

Embodiments provide a display device with improved reliability.

Embodiments also provide a method of providing (or manufacturing) a display device with reduced cost.

Additional features of the invention will be set forth in the description which follows, and in part will be apparent from the description, or may be learned by practice of the inventive concepts.

An embodiment of a display device may include a substrate including a display area and a pad area which is adjacent to the display area, a display part in the display area, on the substrate, a protective layer under the substrate and defining a first opening overlapping the pad area, a rigid support member filling the first opening of the protective layer and including glass, and a driving circuit chip in the pad area, on the substrate.

In an embodiment, a thickness of the support member may be substantially the same as a depth of the first opening of the protective layer.

In an embodiment, a thickness of the support member may be less than a depth of the first opening of the protective layer.

In an embodiment, the protective layer may include a photocurable resin.

In an embodiment, the protective layer may be attached to substrate by an adhesive layer.

In an embodiment, the substrate further may include a bending area between the display area and the pad area. The protective layer may further define a second opening overlapping the bending area.

An embodiment of a display device may include a substrate including a display area and a pad area which is adjacent to the display area, a display part in the display area, on the substrate, a protective layer under the substrate and defining a first opening overlapping the pad area, a rigid support member filling the first opening of the protective layer, and a driving circuit chip in the pad area, on the substrate. A thickness of the support member may be less than a depth of the first opening of the protective layer.

A method of providing a display device may include providing a protective layer under a substrate including a display area and a pad area which is adjacent to the display area, the protective layer defining a first opening overlapping the pad area, providing a rigid support member filling the first opening of the protective layer, and positioning a stage under the protective layer and the support member, and bonding a driving circuit chip to the pad area of the substrate.

In an embodiment, the support member may be provided by jetting liquid glass into the first opening of the protective layer.

In an embodiment, the first opening of the protective layer may expose a lower surface of the substrate.

In an embodiment, a thickness of the support member may be substantially the same as a depth of the first opening of the protective layer.

In an embodiment, the stage may have a substantially flat upper surface.

In an embodiment, a thickness of the support member may be less than a depth of the first opening of the protective layer.

In an embodiment, the stage may include a protrusion that protrudes upward and has a shape corresponding to the first opening of the protective layer. The stage may be positioned under the protective layer and the support member such that the protrusion is inserted into the first opening of the protective layer.

In an embodiment, a sum of a thickness of the support member and a thickness of the protrusion of the stage, may be substantially the same as a depth of the first opening of the protective layer.

In an embodiment, the driving circuit chip may be bonded on the substrate by an ultrasonic bonding method.

In an embodiment, the protective layer may be provided by an inkjet method.

In an embodiment, the protective layer may include a photocurable resin.

In an embodiment, the protective layer may be attached under the substrate by an adhesive layer.

In an embodiment, the substrate may further include a bending area between the display area and the pad area. The protective layer further defines a second opening overlapping the bending area.

The display device according to one or more embodiment may include the display panel, the protective layer under the display panel and defining an opening overlapping the pad area (or, bonding area), and the rigid support member filling the opening. The support member may be provided (or formed) before the bonding process of the driving circuit chip to the pad area of the display panel. Accordingly, low-pressure bonding with a relatively low pressure may be possible. Accordingly, the reliability of the display device may be improved.

In addition, as the support member covers a lower surface of the display panel exposed to outside the protective layer by the opening, it is possible to prevent or reduce defects caused by inflow of foreign substances into the display panel. Accordingly, the reliability of the display device may be improved.

In addition, when the driving circuit chip is bonded by the ultrasonic bonding method, ultrasonic energy may be sufficiently transmitted to the driving circuit chip through support of the rigid support member, to effectively bond the driving circuit chip. Accordingly, the reliability of the display device may be improved. Also, a stage having a substantially flat upper surface can be used to perform the ultrasonic bonding process. Accordingly, the process of providing (or manufacturing) the display device may be simplified and cost may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
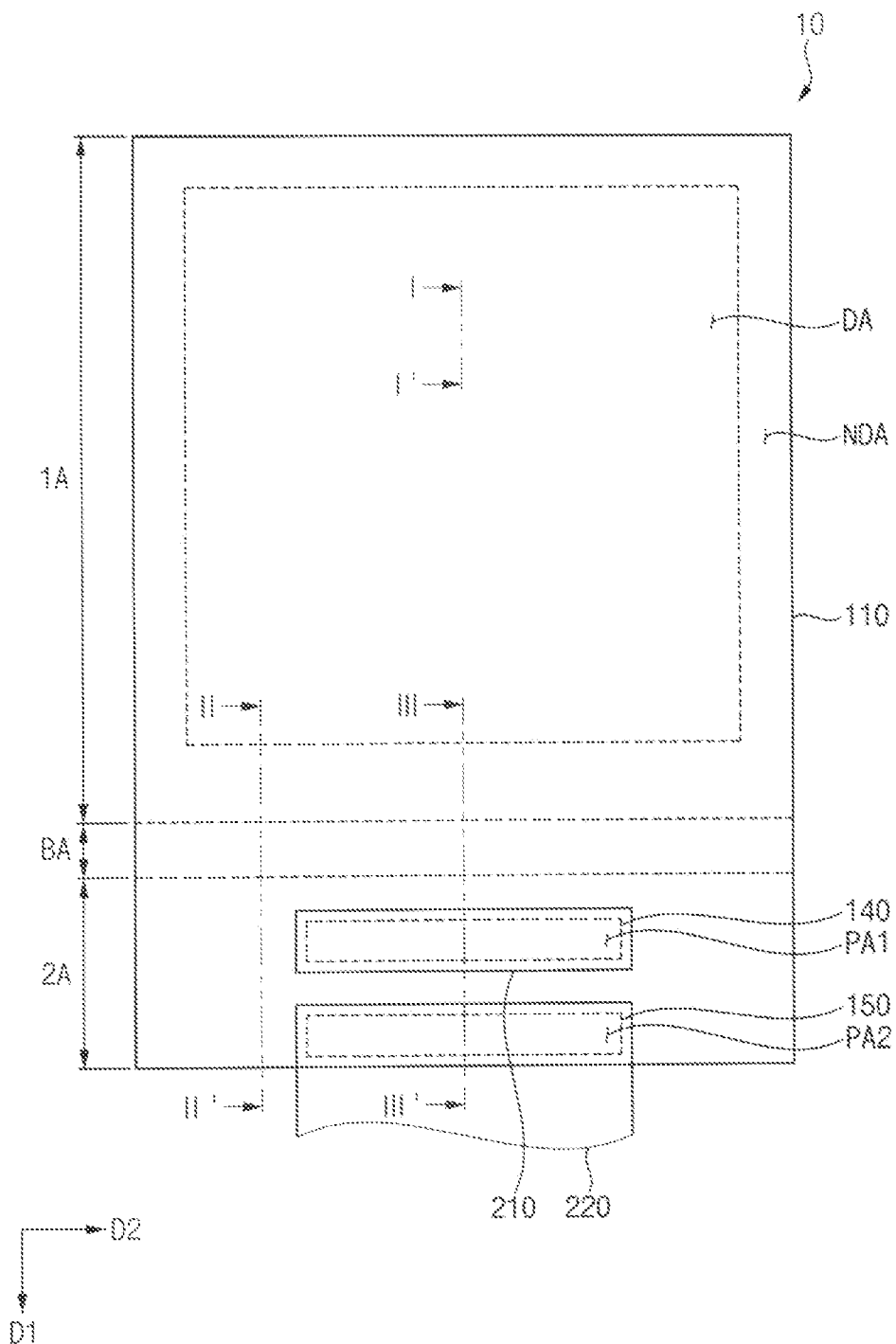
FIGS. 1 and 2 are plan views illustrating embodiments of a display device.

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to an element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
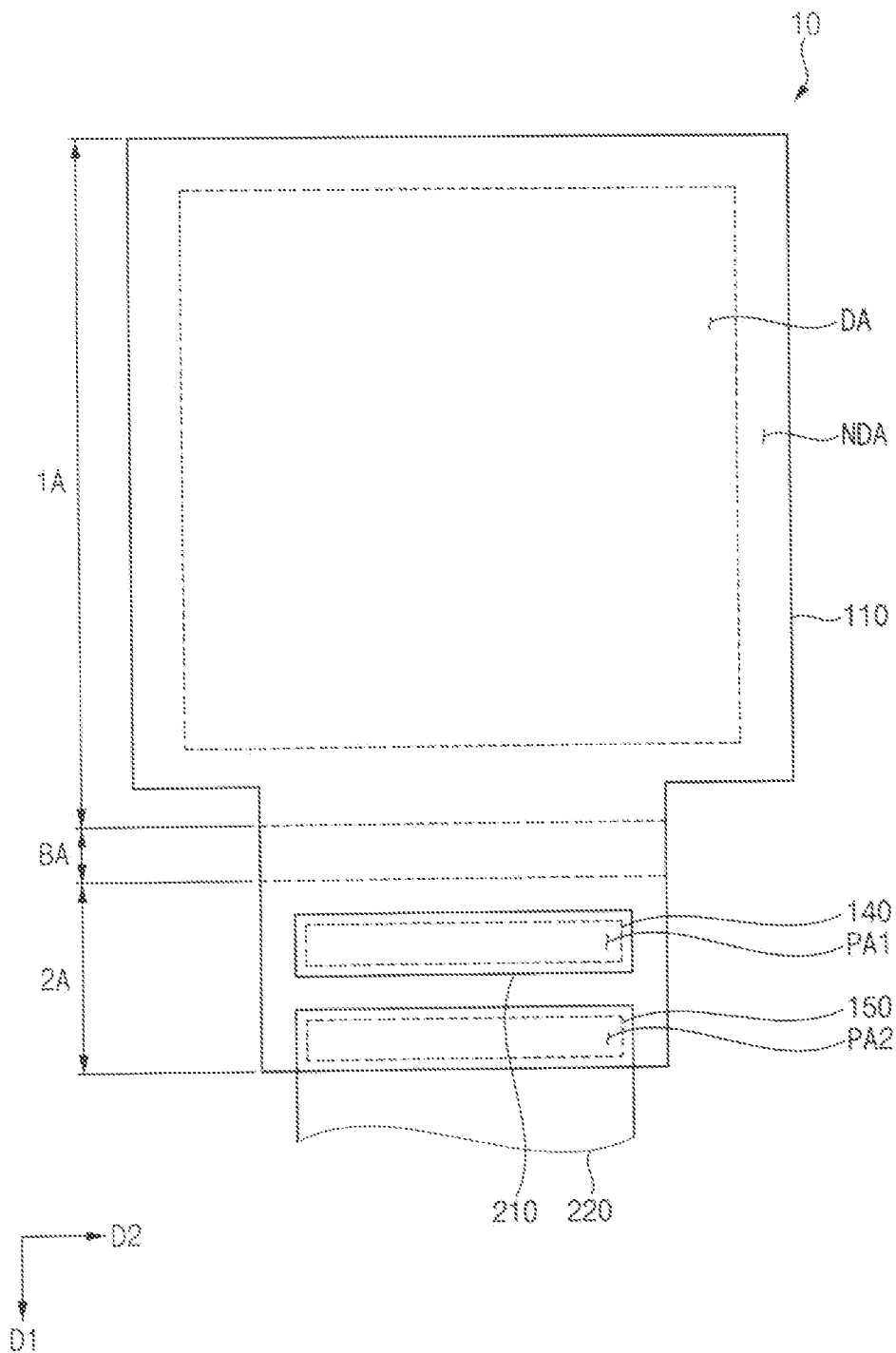
Figure 3:
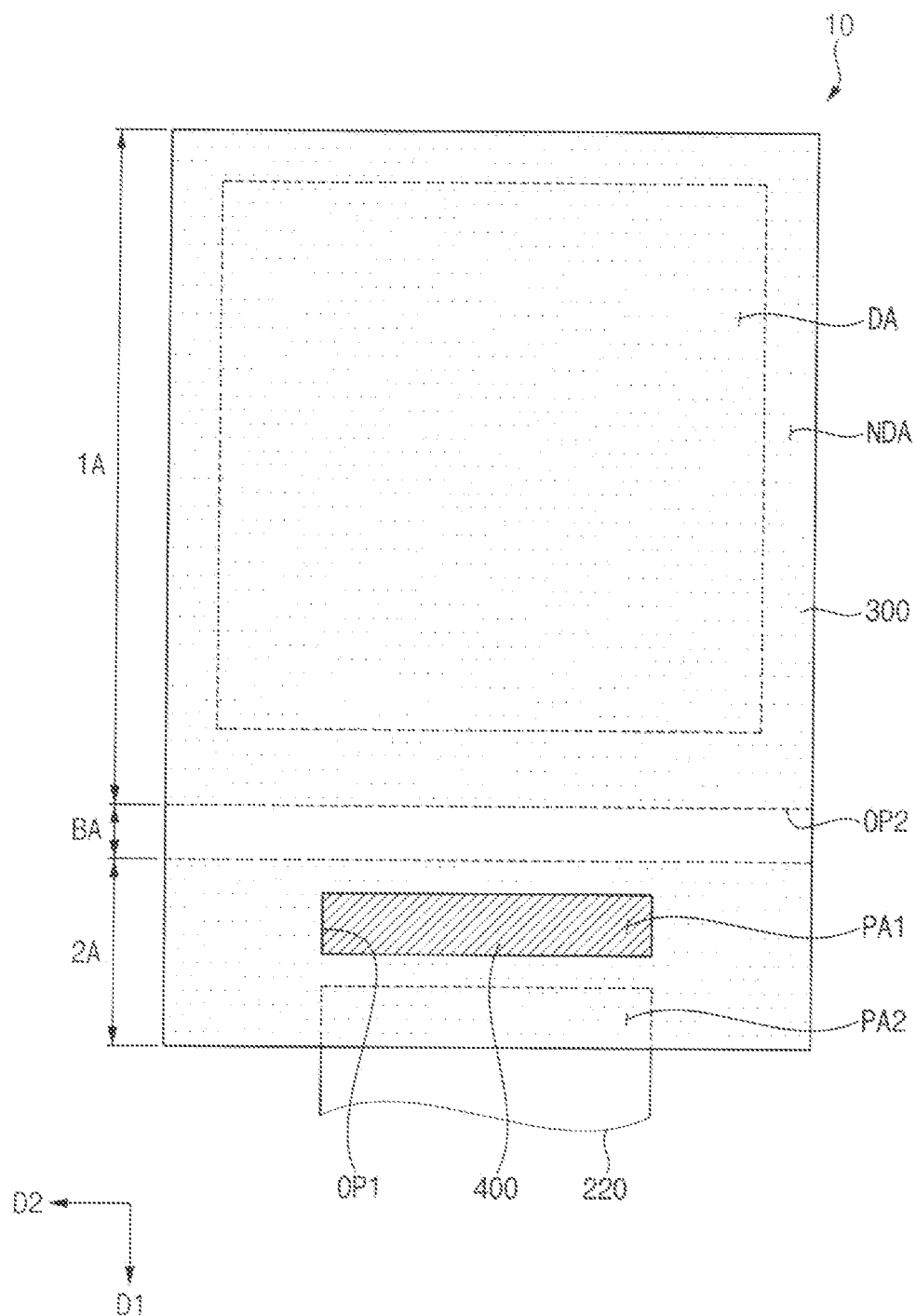
FIG. 3 is a bottom view of the display device of FIG. 1.
Figure 4:
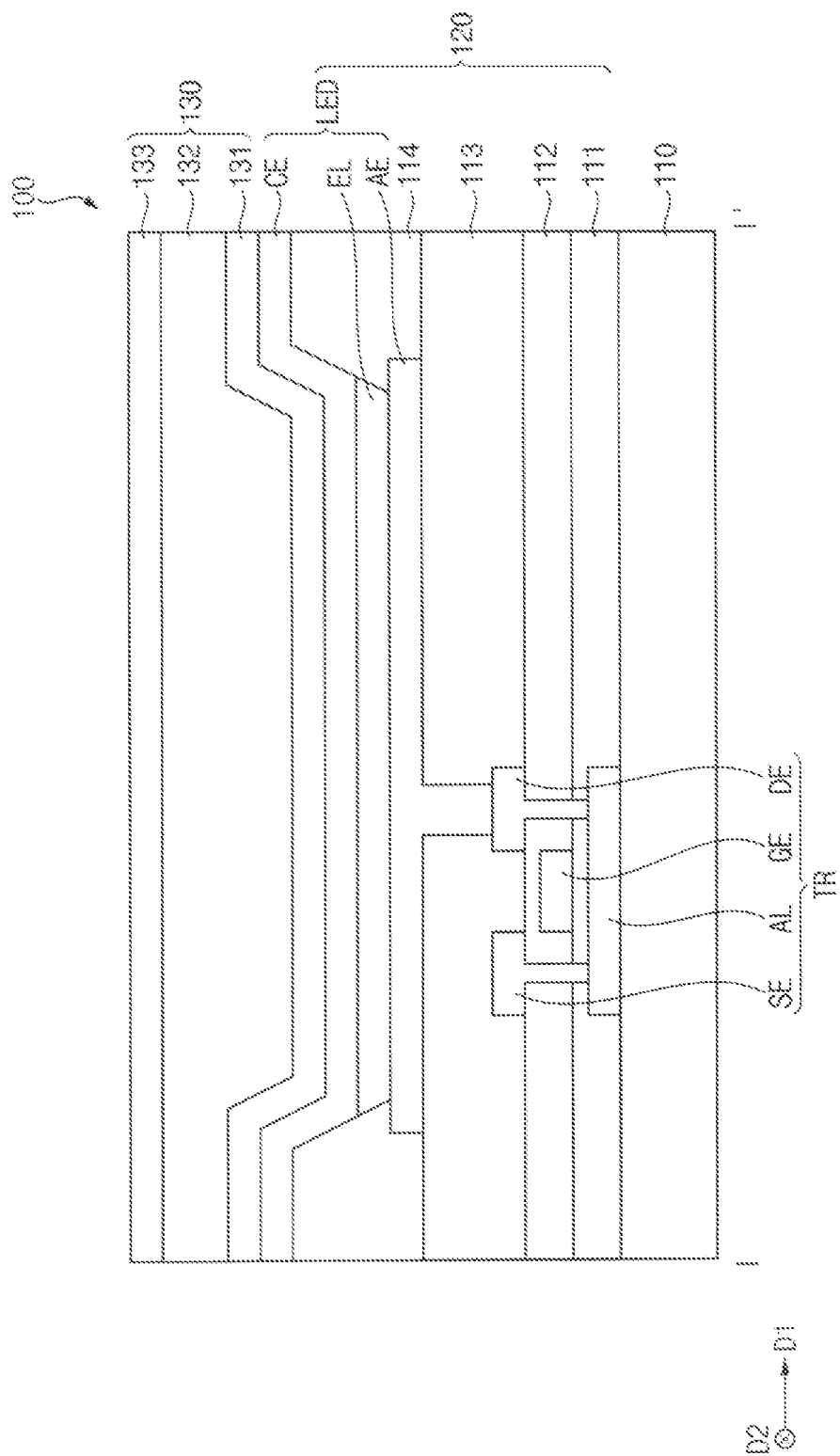
FIG. 4 is a cross-sectional view taken along line I-I' of FIG. 1.
Figure 5:
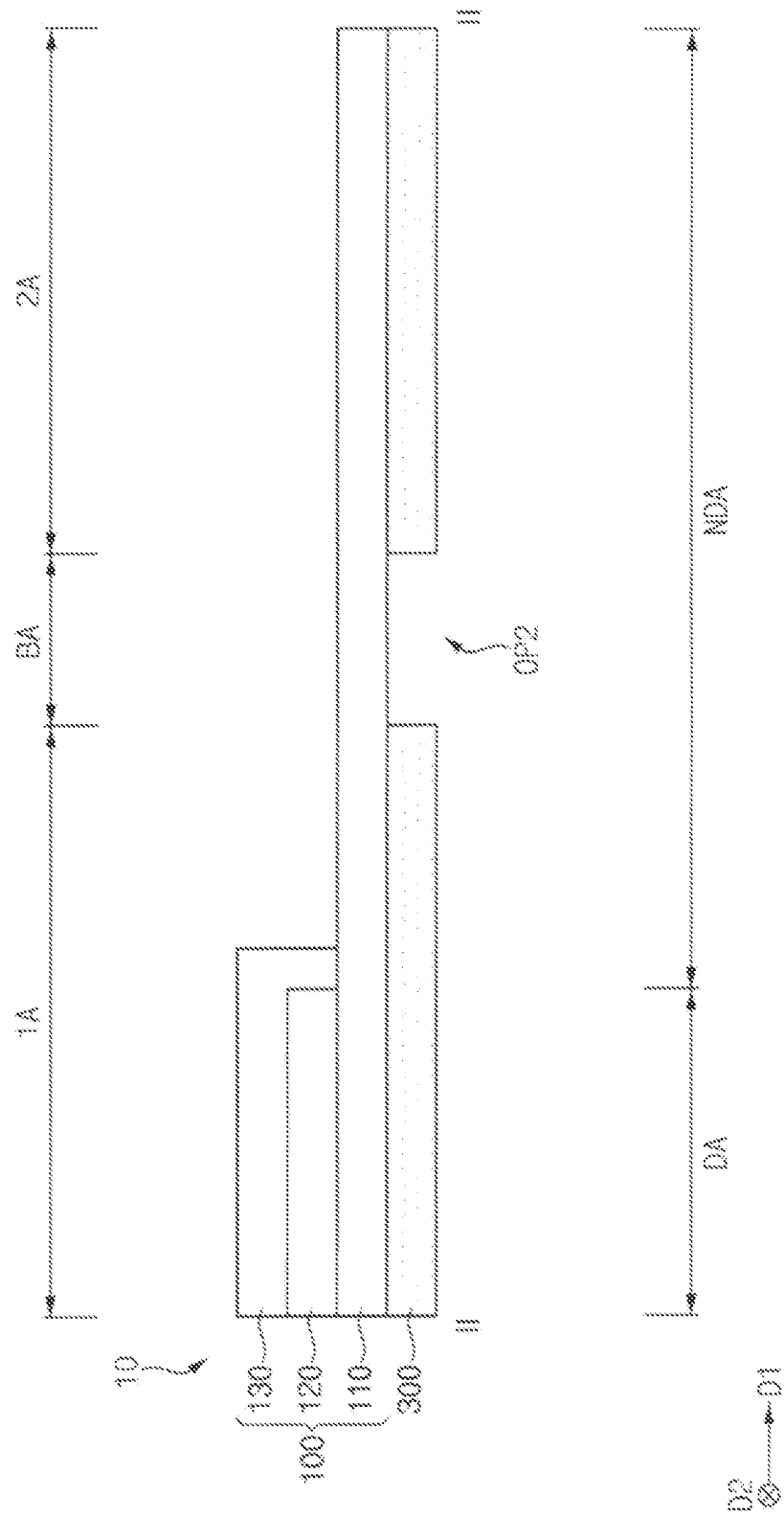
FIG. 5 is a cross-sectional view taken along line II-II' of FIG. 1.
Figure 6:
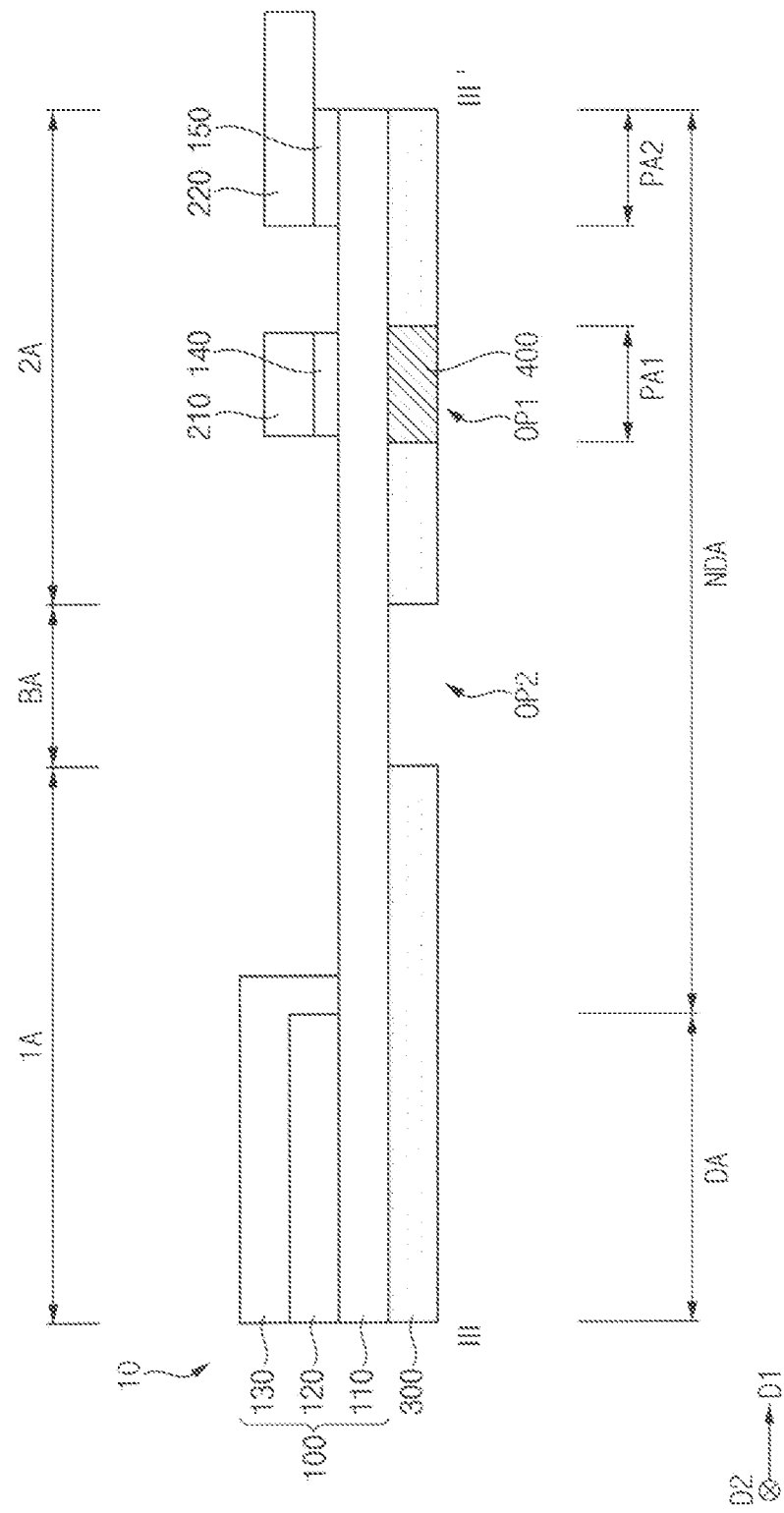
FIG. 6 is a cross-sectional view taken along line III-III' of FIG. 1.
Figure 7:
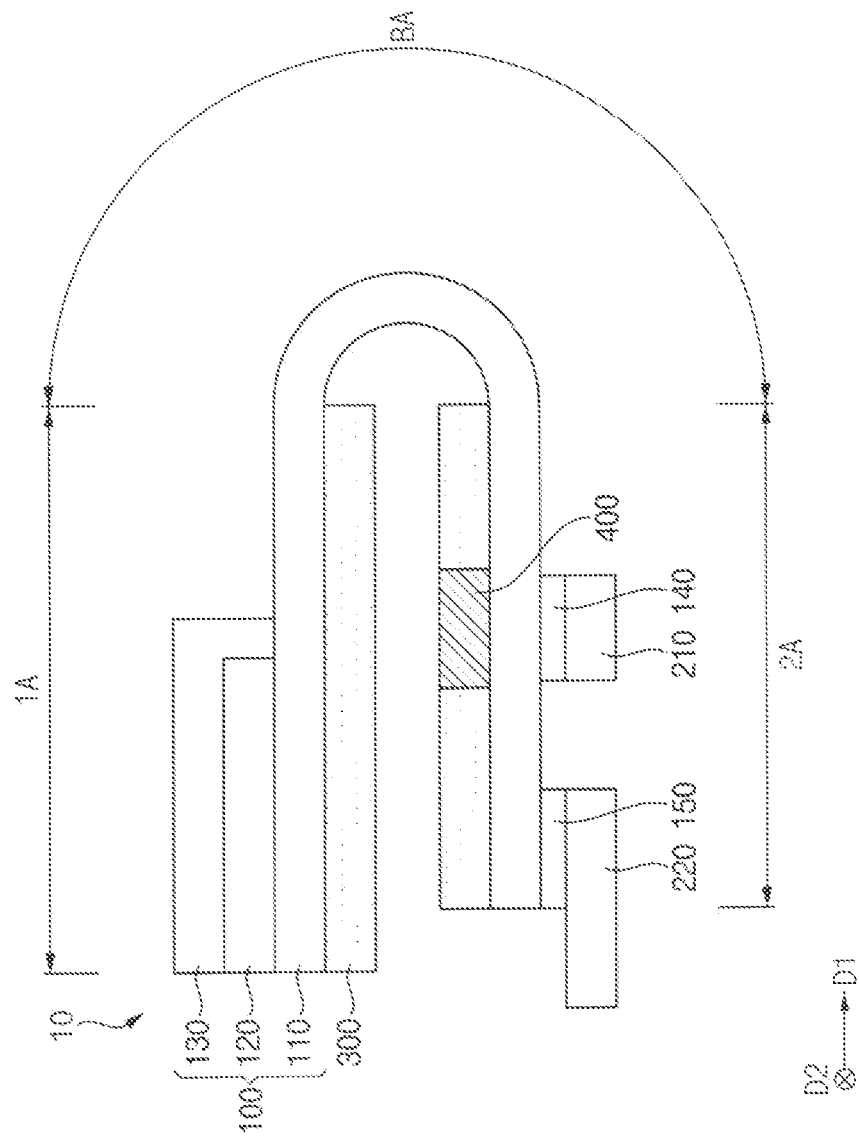
FIG. 7 is a cross-sectional view illustrating an embodiment of the display device of FIG. 6 which is bent.

FIGS. 1 and 2 are plan views illustrating an embodiment of a display device 10. FIG. 3 is a bottom view of the display device 10 of FIG. 1. FIG. 4 is a cross-sectional view taken along line I-I' of FIG. 1. FIG. 5 is a cross-sectional view taken along line II-II' of FIG. 1. FIG. 6 is a cross-sectional view taken along line of FIG. 1. FIG. 7 is a cross-sectional view illustrating a bent configuration of the display device 10 of FIG. 6.

Referring to FIGS. 1 to 7, a display device 10 may include a display panel 100, a driving circuit chip 210, a circuit board 220, a protective layer 300, and a support member 400.

The display panel 100 may include a substrate 110, a display part 120, an encapsulation layer 130, a first pad part 140, and a second pad part 150.

The substrate 110 may be a flexible and insulating substrate. In an embodiment, for example, the substrate 110 may include (or may be) a transparent resin substrate. The substrate 110 may include a polyimide substrate. In this case, the substrate 110 may have a multi-layered structure in which one or more polyimide layer and one or more barrier layer are alternately stacked.

The substrate 110 (or the display panel 100 or the display device 10) may include a display area DA and a non-display area NDA. The display part 120 including a plurality of pixels for generating an image may be disposed in the display area DA on the substrate 110. Light emitted from each of the pixels may be combined to generate the image. The non-display area NDA may be positioned adjacent to the display area DA, such as extending around the display area DA. In an embodiment, for example, the non-display area NDA may surround the display area DA in a plan view.

The non-display area NDA may include a first pad area PA1 and a second pad area PA2 which are adjacent to the display area DA, such as being positioned around the display area DA. In an embodiment, for example, the first pad area PA1 may be spaced apart from the display area DA in (or along) a first direction D1. The second pad area PA2 may be spaced apart from the first pad area PA1 in the first direction D1.

In an embodiment, the substrate 110 (or the display panel 100 or the display device 10) may include a first area 1A, a second area 2A, and a bending area BA. The second area 2A may be spaced apart from the first area 1A in the first direction D1. The bending area BA may be positioned between the first area 1A and the second area 2A. The bending area BA of the substrate 110 may be bendable along a bending axis extending in a second direction D2 which crosses the first direction D1, such as being perpendicular to the first direction D1. In an embodiment, for example, as illustrated in FIG. 7, the bending area BA of the substrate 110 may be bent such that the second area 2A is positioned under the first area 1A. That is, the display device 10 (or the display panel 100) which is bent at the bending area BA may dispose the second area 2A facing the first area 1A along a thickness direction of the display device 10 (or the display panel 100). The thickness direction may cross each of the first direction D1 and the second direction D2, such as being orthogonal thereto.

As illustrated in FIG. 1, for example, the first area 1A may include the display area DA and a portion of the non-display area NDA, and the bending area BA may include another portion of the non-display area NDA, and the second area 2A may include the first pad area PA1, the second pad area PA2, and still another portion of the non-display area NDA. That is, the bending area BA may be positioned between the display area DA and the first pad area PA1. However, this is exemplary and embodiments are not limited thereto.

In an embodiment, as illustrated in FIG. 1, the first area 1A, the bending area BA, and the second area 2A may have substantially the same width in the second direction D2. That is, the substrate 110 may have an overall rectangular shape in a plan view.

In an embodiment, as illustrated in FIG. 2, each of a width of the bending area BA in the second direction D2 and a width of the second area 2A in the second direction D2 may be less than a width of the first area 1A in the second direction D2. In an embodiment, for example, in a portion of the first area 1A adjacent to the bending area BA (or closest to the bending area BA), the width of the substrate 110 may be narrowed as compared to a width of a remaining portion of the first area 1A. In an embodiment, for example, the width of the bending area BA in the second direction D2 may be substantially the same as the width of the second area 2A in the second direction D2.

The display part 120 may be disposed in the display area DA, on the substrate 110. The display part 120 may include the pixels. In an embodiment, for example, the pixels may be arranged in a matrix form along the first direction D1 and the second direction D2. Each of the pixels may include at least one thin film transistor TR and a light emitting element LED.

An active layer AL may be disposed on the substrate 110. The active layer AL may include an oxide semiconductor, a silicon semiconductor, an organic semiconductor, or the like. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like. The active layer AL may include a source area, a drain area, and a channel area positioned between the source area and the drain area.

In an embodiment, although not illustrated in the drawings, a buffer layer may be disposed between the substrate 110 and the active layer AL. The buffer layer may prevent or reduce instances of impurities diffusing into the active layer AL from the substrate 110. The buffer layer may include an inorganic insulating material such as a silicon compound, a metal oxide, or the like. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. These can be used alone or in a combination thereof. The buffer layer may have a single-layered structure or a multi-layered structure including a plurality of insulating layers. In an embodiment, the buffer layer may be disposed in an entirety of the display area DA and an entirety of the non-display area NDA, on the substrate 110.

A first insulating layer 111 may be disposed on the active layer AL. The first insulating layer 111 may cover the active layer AL on the substrate 110. The first insulating layer 111 may include an inorganic insulating material. In an embodiment, for example, the first insulating layer 111 may be disposed in an entirety of the display area DA and an entirety of the non-display area NDA.

A gate electrode GE may be disposed on the first insulating layer 111. The gate electrode GE may overlap the channel area of the active layer AL. The gate electrode GE may include a conductive material such as a metal, an alloy, a conductive metal nitride, a conductive metal oxide, a transparent conductive material, or the like. Examples of the conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like. These can be used alone or in a combination thereof. The gate electrode GE may have a single-layered structure or a multi-layered structure including a plurality of conductive layers.

A second insulating layer 112 may be disposed on the gate electrode GE. The second insulating layer 112 may cover the gate electrode GE on the first insulating layer 111. The second insulating layer 112 may include an inorganic insulating material. In an embodiment, for example, the second insulating layer 112 may be disposed in an entirety of the display area DA and an entirety of the non-display area NDA.

A source electrode SE and a drain electrode DE may be disposed on the second insulating layer 112. The source electrode SE and the drain electrode DE may be connected to the source area and the drain area of the active layer AL, respectively. Each of the source electrode SE and the drain electrode DE may include a conductive material. The active layer AL, the gate electrode GE, the source electrode SE, and the drain electrode DE may together form the thin film transistor TR.

A third insulating layer 113 may be disposed on the source electrode SE and the drain electrode DE. The third insulating layer 113 may include an organic insulating material. Examples of the organic insulating material include a photoresist, a polyacryl-based resin, a polyimide-based resin, a polyamide-based resin, a siloxane-based resin, an acryl-based resin, an epoxy-based resin, or the like. These can be used alone or in a combination thereof. In an embodiment, the third insulating layer 113 may have a multi-layered structure including one or more organic insulating layers and one or more inorganic insulating layers.

An anode electrode AE may be disposed on the third insulating layer 113. The anode electrode AE may include a conductive material. The anode electrode AE may be connected to the drain electrode DE through a contact hole formed in the third insulating layer 113. Accordingly, the anode electrode AE may be electrically connected to the thin film transistor TR.

A fourth insulating layer 114 may be disposed on the anode electrode AE. The fourth insulating layer 114 may cover a peripheral portion of the anode electrode AE (e.g., outer edge), and may define a pixel opening exposing a central portion of the anode electrode AE to outside the fourth insulating layer 114. The fourth insulating layer 114 may include an organic insulating material.

An emission layer EL may be disposed on the anode electrode AE. The emission layer EL may be disposed in the pixel opening of the fourth insulating layer 114. In embodiments, the emission layer EL may include at least one of an organic light emitting material and quantum dot.

In an embodiment, the organic light emitting material may include a low molecular organic compound or a high molecular organic compound. Examples of the low molecular organic compound may include copper phthalocyanine, N,N'-diphenylbenzidine, tris-(8-hydroxyquinoline)aluminum, or the like. Examples of the high molecular organic compound may include poly(3,4-ethylenedioxythiophene), polyaniline, poly-phenylenevinylene, polyfluorene, or the like. These can be used alone or in a combination thereof.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell which surrounds the core. The shell may serve as a protection layer for preventing the core from being chemically denatured to maintain semiconductor characteristics, and may serve as a charging layer for imparting electrophoretic characteristics to the quantum dot.

A cathode electrode CE may be disposed on the emission layer EL. The cathode electrode CE may also be disposed on the fourth insulating layer 114. The cathode electrode CE may include a conductive material. The anode electrode AE, the emission layer EL, and the cathode electrode CE may together form the light emitting element LED.

The encapsulation layer 130 may be disposed on the cathode electrode CE. The encapsulation layer 130 may include at least one inorganic encapsulation layer and at least one organic encapsulation layer. In an embodiment, the encapsulation layer 130 includes a first inorganic encapsulation layer 131 disposed on the cathode electrode CE, an organic encapsulation layer 132 disposed on the first inorganic encapsulation layer 131, and a second inorganic encapsulation layer 133 disposed on the organic encapsulation layer 132.

The first pad part 140 may be disposed in the first pad area PA1, on the substrate 110. The second pad part 150 may be disposed in the second pad area PA2, on the substrate 110. Each of the first pad part 140 and the second pad part 150 may include a plurality of pad electrodes arranged in the second direction D2. The pad electrodes may be electrically connected to the pixels of the display part 120 through a plurality of wires. In an embodiment, for example, the pad electrodes may be disposed on the same layer as the source electrode SE and the drain electrode DE. However, embodiments are not limited thereto, and the pad electrodes may be disposed on the same layer as another conductive layers such as the gate electrode GE, the anode electrode AE, or the like. In addition, the pad electrodes may have a multi-layered structure including a plurality of conductive layers. As being on a same layer, elements may be in a same layer as each other as respective portions of a same material layer, may form an interface with a same underlying or overlying layer, etc., without being limited thereto.

The driving circuit chip 210 may be disposed in the first pad area PA1 on the display panel 100. That is, the driving circuit chip 210 may be disposed in the second area 2A of the display panel 100. In an embodiment, for example, the driving circuit chip 210 may be directly mounted on the display panel 100 in a chip on plastic (COP) method. The driving circuit chip 210 may be electrically connected to the first pad part 140.

The circuit board 220 may be disposed in the second pad area PA2 on the display panel 100. That is, the circuit board 220 may disposed in the second area 2A of the display panel 100 to be spaced apart from the driving circuit chip 210 in the first direction D1. The circuit board 220 may be electrically connected to the second pad part 150.

In an embodiment, the circuit board 220 may be a flexible printed circuit board (FPCB). A first end of the circuit board 220 may be attached to the display panel 100, at the second pad area PA2. A printed circuit board (PCB) (not illustrated) may be attached to a second end of the circuit board 220 which is opposite to the first end.

The driving circuit chip 210, the circuit board 220, and the printed circuit board may provide a driving signal to the display panel 100. The driving signal may include various electrical signals for driving the display panel 100 such as driving voltage, a gate signal, a data signal, or the like.

The protective layer 300 may be disposed under the display panel 100 to protect the display panel 100 from external impact. The protective layer 300 may define a first opening OP1 and a second opening OP2. A sidewall of the protective layer 300 may define the first opening OP1 and the second opening OP2.

The first opening OP1 may overlap (or correspond to) the first pad area PA1. In an embodiment, for example, the protective layer 300 may expose the first pad area PA1 of a lower surface of the substrate 110 to outside the protective layer 300 at the first opening OP1.

The second opening OP2 may overlap the bending area BA and extend in the second direction D2. The protective layer 300 may be open at opposing ends thereof along the second direction D2, by the second opening OP2, without being limited thereto. The protective layer 300 may include a first portion and a second portion spaced apart from each other by the second opening OP2. That is, the protective layer 300 is disconnected at the bending area BA, by the second opening OP2. The first portion of the protective layer 300 may overlap the first area 1A.

The second portion of the protective layer 300 may overlap the second area 2A and may be spaced apart from the first portion in the first direction D1. The second portion of the protective layer 300 may define the first opening OP1 and surround the first opening OP1 in a plan view (refer to FIG. 3). That is, the first opening OP1 may be an enclosed opening defined by a solid portion of the second portion of the protective layer 300.

In an embodiment, an upper surface of the protective layer 300 may be closest to the substrate 110 and may directly contact a lower surface of the substrate 110 which is furthest from the display part 120. In an embodiment, for example, the protective layer 300 may be formed by an inkjet method.

In an embodiment, the protective layer 300 may include a photocurable resin. Examples of the photocurable resin may include epoxy acrylate resin, polyester acrylate resin, urethane acrylate resin, polyether acrylate resin, silicone acrylate resin, alkyl acrylate resin, or the like, but embodiments are not limited thereto. These can be used alone or in a combination thereof. In an embodiment, the protective layer 300 may include a thermocurable resin.

The support member 400 may be disposed in the first opening OP1 of the protective layer 300. The support member 400 may fill the first opening OP1 of the protective layer 300. That is, the support member 400 may cover the first pad area PA1 of the lower surface of the substrate 110 which is exposed to outside the protective layer 300 by the first opening OP1. Accordingly, the support member 400 may prevent or reduce defects caused by inflow of foreign substances through the lower surface of the substrate 110 which is exposed by the first opening OP1.

The support member 400 may include a rigid material and may have rigidity. In an embodiment, the support member 400 may include glass. The support member 400 may include silica glass. However, embodiments are not limited thereto, and the support member 400 may include another rigid material such as a metal, an alloy, or the like. In an embodiment, each of the substrate 110 and the support member 400 may have a rigidity, and the rigidity of the support member 400 may be greater than the rigidity of the substrate 110, without being limited thereto.

As will be described later, the rigid support member 400 may be formed (or provided) before a bonding process of the driving circuit chip 210. Accordingly, during the bonding process of the driving circuit chip 210, the rigid support member 400 may support the display panel 100 at the first pad area PA1 to enable low-pressure bonding. In addition, when the driving circuit chip 210 is bonded by an ultrasonic bonding method, ultrasonic energy may be sufficiently transmitted to the driving circuit chip 210 through the rigid support member 400, and a stage having a substantially flat upper surface (e.g., a rigid stage 500 in FIG. 10) can be used to perform the ultrasonic bonding process.

In an embodiment, a thickness of the support member 400 may be substantially the same as a depth of the first opening OP1 of the protective layer 300, taken in the thickness direction (e.g., the third direction). That is, the support member 400 may entirely fill the first opening OP1 of the protective layer 300. The thickness of the support member 400 may be substantially the same as a thickness of the protective layer 300. Lower surfaces of the protective layer 300 and the support member 400 which are furthest from the substrate 110 may be coplanar with each other, without being limited thereto. In an embodiment, for example, the support member 400 may be formed by jetting a liquid state rigid material (e.g., liquid glass) into the first opening OP1 of the protective layer 300 using an inkjet method and curing the jetted rigid material to form a glass support member.

FIGS. 8 to 12 are cross-sectional views illustrating embodiments of processes in a method of manufacturing (or providing) the display device 10 of FIG. 1.

Figure 8:
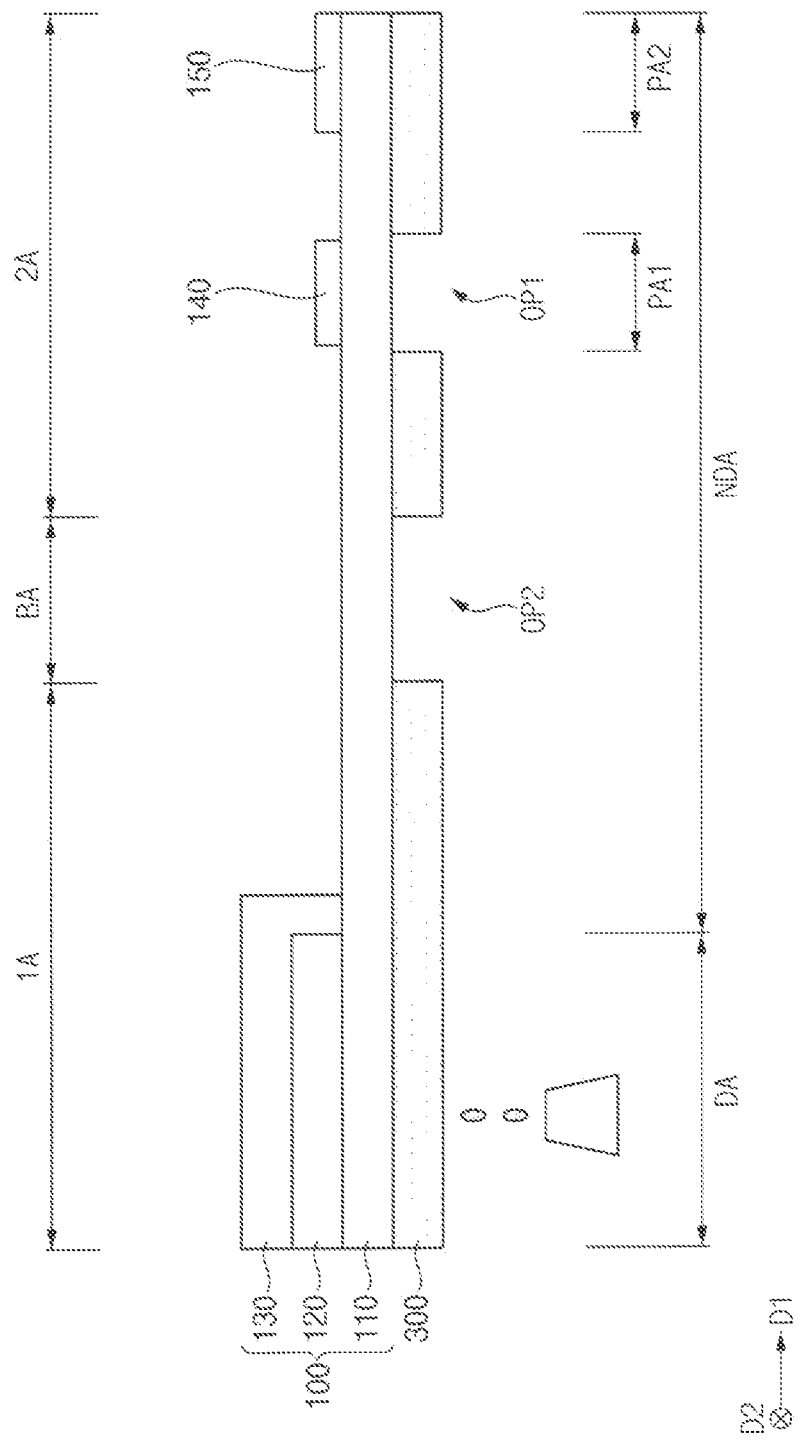
FIGS. 8 to 12 are cross-sectional views illustrating an embodiment of a method of providing the display device of FIG. 1.

Referring to FIG. 8, the protective layer 300 may be formed under the display panel 100 including the substrate 110, the display part 120, the encapsulation layer 130, the first pad part 140, and the second pad part 150.

In an embodiment, the protective layer 300 may be formed on the lower surface of the substrate 110 by an inkjet method. In an embodiment, for example, the protective layer 300 may be formed by an inkjet method in a state in which the display panel 100 is turned over such that the lower surface of the substrate 110 faces upward, but the following description will be based on FIG. 8.

An ink composition including a photocurable resin may be provided on the lower surface of the substrate 110 as an inkjet-provided material. The ink composition may be selectively provided in an area of the substrate 110 which excludes the bending area BA and the first pad area PA1. Then, the ink composition may be cured by irradiating light (e.g., ultraviolet ("UV") light) to the ink composition. Accordingly, the protective layer 300 defining the first opening OP1 overlapping the first pad area PA1, and the second opening OP2 overlapping the bending area BA, may be formed. The upper surface of the protective layer 300 which is closest to the substrate 110 may directly contact the lower surface of the substrate 110 which is furthest from the display part 120.

Figure 9:
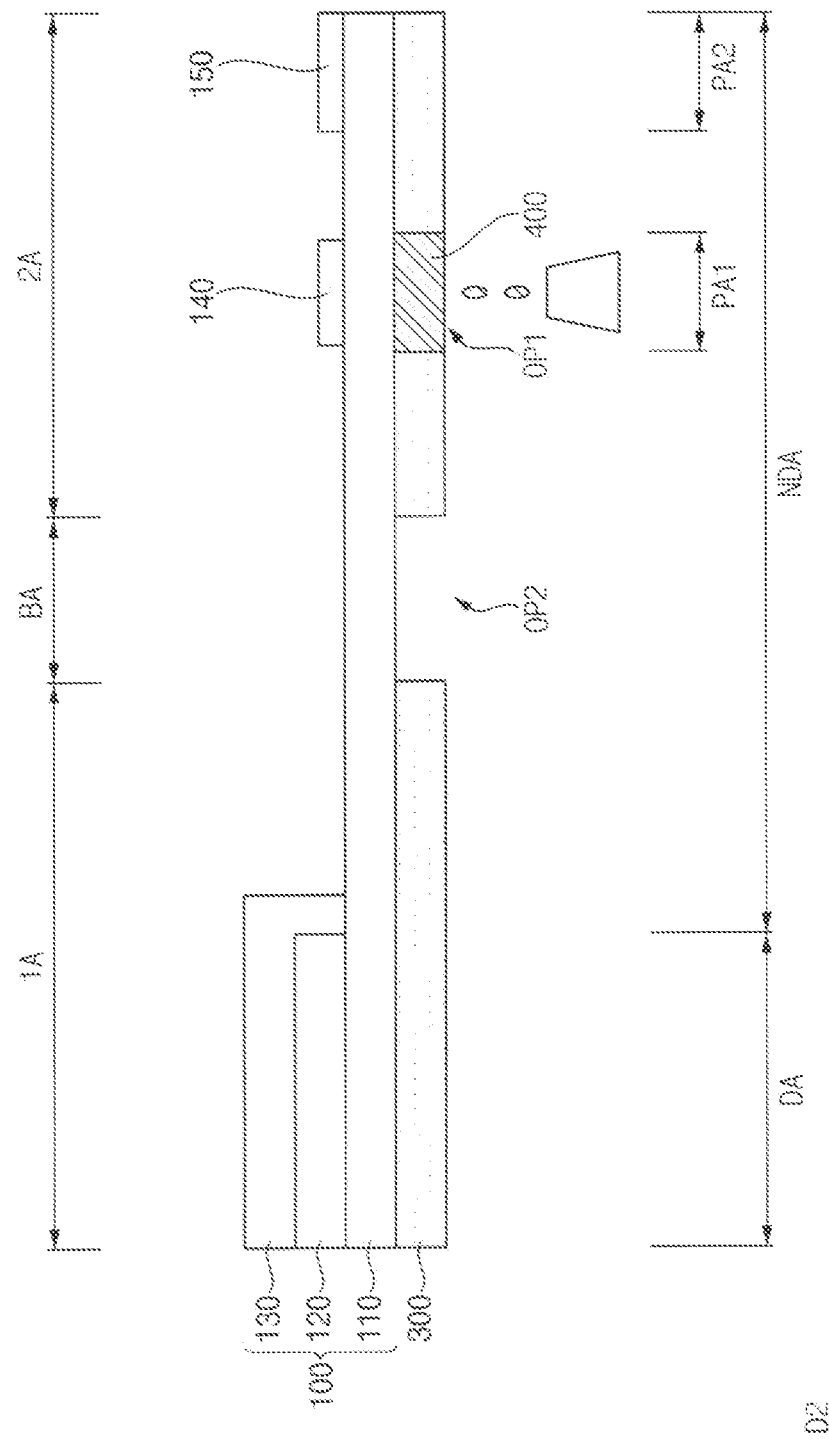

Referring to FIG. 9, the rigid support member 400 may be formed in the first opening OP1 of the protective layer 300.

In an embodiment, the support member 400 may be formed in the first opening OP1 of the protective layer 300 by an inkjet method. In an embodiment, for example, the support member 400 may be formed by an inkjet method in a state in which the display panel 100 and the protective layer 300 are turned over such that a lower surface of the protective layer 300 faces upward, but the following description will be based on FIG. 9.

An ink composition including a liquid state rigid material may be provided into the first opening OP1 of the protective layer 300 as an inkjet-provided material. In an embodiment, for example, the ink composition may include liquid glass, liquid metal paste, or the like.

In an embodiment, the ink composition may be provided into the first opening OP1 to entirely fill the first opening OP1 of the protective layer 300. That is, a thickness of the ink composition provided into the first opening OP1 may be substantially the same as the depth of the first opening OP1. Subsequently, the ink composition may be cured to form the rigid support member 400. The thickness of the support member 400 may be substantially same as the depth of the first opening OP1. That is, the lower surface of the protective layer 300 and the lower surface of the support member 400 which are furthest from the substrate 110 may be positioned on substantially the same plane (e.g., coplanar with each other).

In an embodiment, the support member 400 may include glass. The support member 400 may include silica glass. However, embodiments are not limited thereto, and the support member 400 may include another rigid material such as a metal, an alloy, or the like. The support member 400 may have a rigidity which is higher than a rigidity of the substrate 110 and/or the protective layer 300, without being limited thereto.

Figure 10:
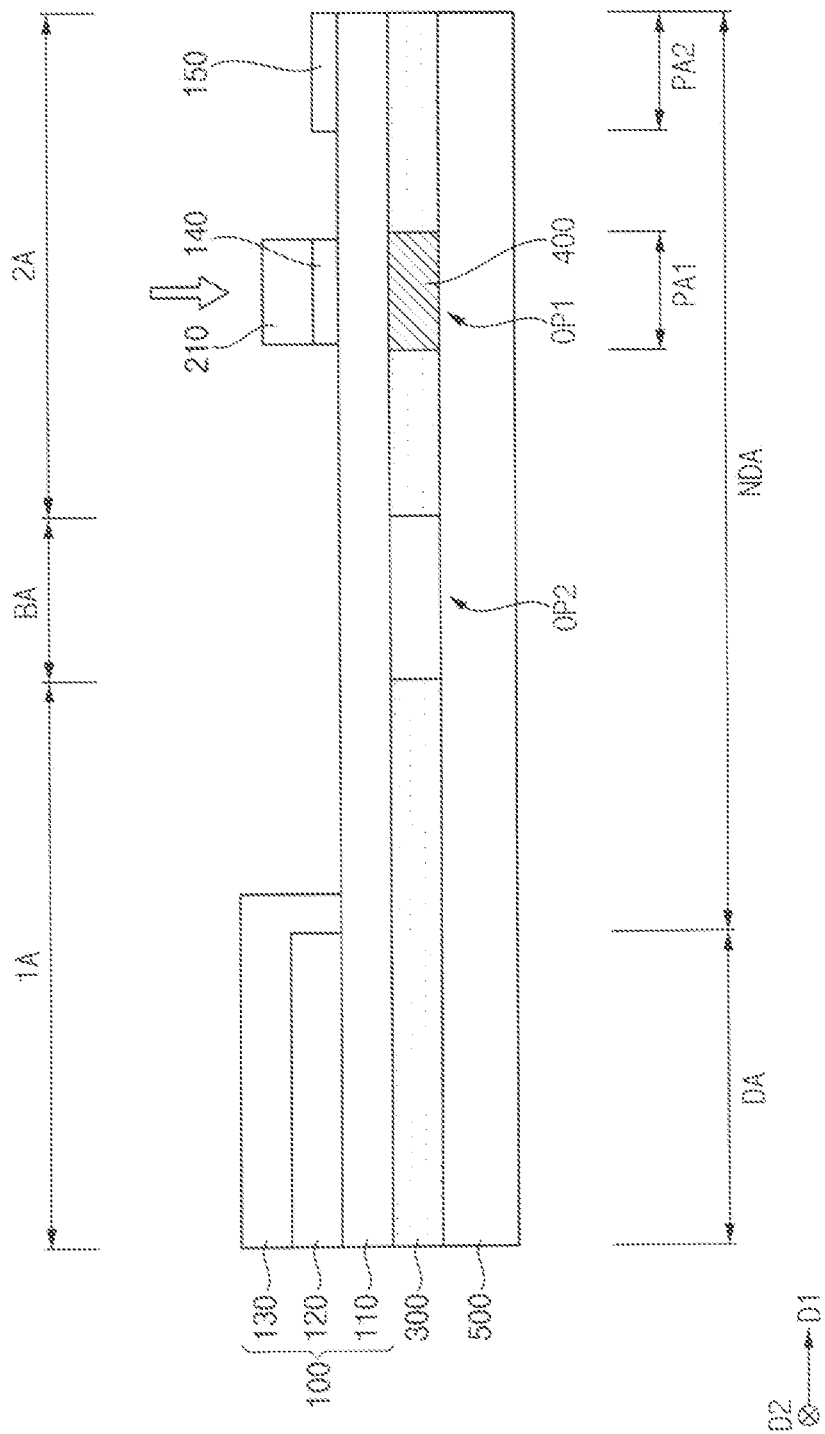

Referring to FIG. 10, the driving circuit chip 210 may be bonded in the first pad area PA1 on the display panel 100.

A rigid stage 500 may be positioned under the protective layer 300 and the support member 400. In an embodiment, the rigid stage 500 may have a substantially flat upper surface. The rigid stage 500 may have a rigidity which is higher than a rigidity of the substrate 110 and/or the protective layer 300, without being limited thereto.

Subsequently, the driving circuit chip 210 may be bonded in the first pad area PA1 of the display panel 100 by applying pressure (or, pressure and heat) to an upper surface of the driving circuit chip 210 using a compression head (not illustrated).

In an embodiment, the driving circuit chip 210 may be bonded in the first pad area PA1 of the display panel 100 by an ultrasonic bonding method. In an embodiment, for example, corresponding to a relatively narrow pitch (e.g., fine pitch) of bump electrodes (not shown) of the driving circuit chip 210, the driving circuit chip 210 may be bonded by the ultrasonic bonding method having high bonding reliability. In a conventional display device, if the protective layer 300 does not define the first opening OP1 and extends across the first pad area PA1 under the substrate 110, as the protective layer 300 absorbs ultrasonic energy from the ultrasonic bonding method, a bonding defect in which the pad electrodes of the first pad part 140 and the bump electrodes of the driving circuit chip 210 are not bonded on each other may occur.

However, according to one or more embodiment, the protective layer 300 may define the first opening OP1 overlapping the first pad area PA1, and the rigid support member 400 may be disposed in the first opening OP1. Accordingly, ultrasonic energy from the ultrasonic bonding method may be sufficiently transmitted to the pad electrodes of the first pad part 140 and the bump electrodes of the driving circuit chip 210 through support provided by the rigid support member 400 under the substrate 110 at the first pad part 140, so that the pad electrodes of the first pad part 140 and the bump electrodes of the driving circuit chip 210 may be sufficiently bonded. Accordingly, a reliability of the display device 10 may be improved.

In addition, as the bonding process of the driving circuit chip 210 is performed in a state in which the rigid support member 400 fills the first opening OP1 of the protective layer 300, the rigid stage 500 having the substantially flat upper surface can be used to perform the ultrasonic bonding process. Accordingly, a process of preparing a stage having a protrusion corresponding to the first opening OP1 of the protective layer 300 and aligning the stage such that the protrusion is inserted into the first opening OP1 may be obviated. Accordingly, the process of providing the display device 10 may be simplified and cost may be reduced.

In addition, as the bonding process of the driving circuit chip 210 is performed in a state in which the rigid support member 400 supports the first pad area PA1 of the display panel 100, low-pressure bonding with a relatively low pressure than when the bonding process of the driving circuit chip 210 is performed in a state in which the protective layer 300 having a relatively low hardness (or low rigidity) supports the first pad area PA1 of the display panel 100, may be possible. Accordingly, preventing or reducing damage to the display panel 100 at the first pad area PA1 and components (e.g., the wires) positioned around the first pad area PA1 by a high pressure may be possible. Accordingly, the reliability of the display device 10 may be improved.

In an embodiment, the driving circuit chip 210 may be bonded in the first pad area PA1 on the display panel 100 by an anisotropic conductive film (ACF) bonding method using an anisotropic conductive film (ACF). Even in this case, the bonding process of the driving circuit chip 210 may be performed in a state in which the rigid support member 400 supports the first pad area PA1 of the display panel 100. Accordingly, low-pressure bonding with a relatively low pressure may be possible.

Figure 11:
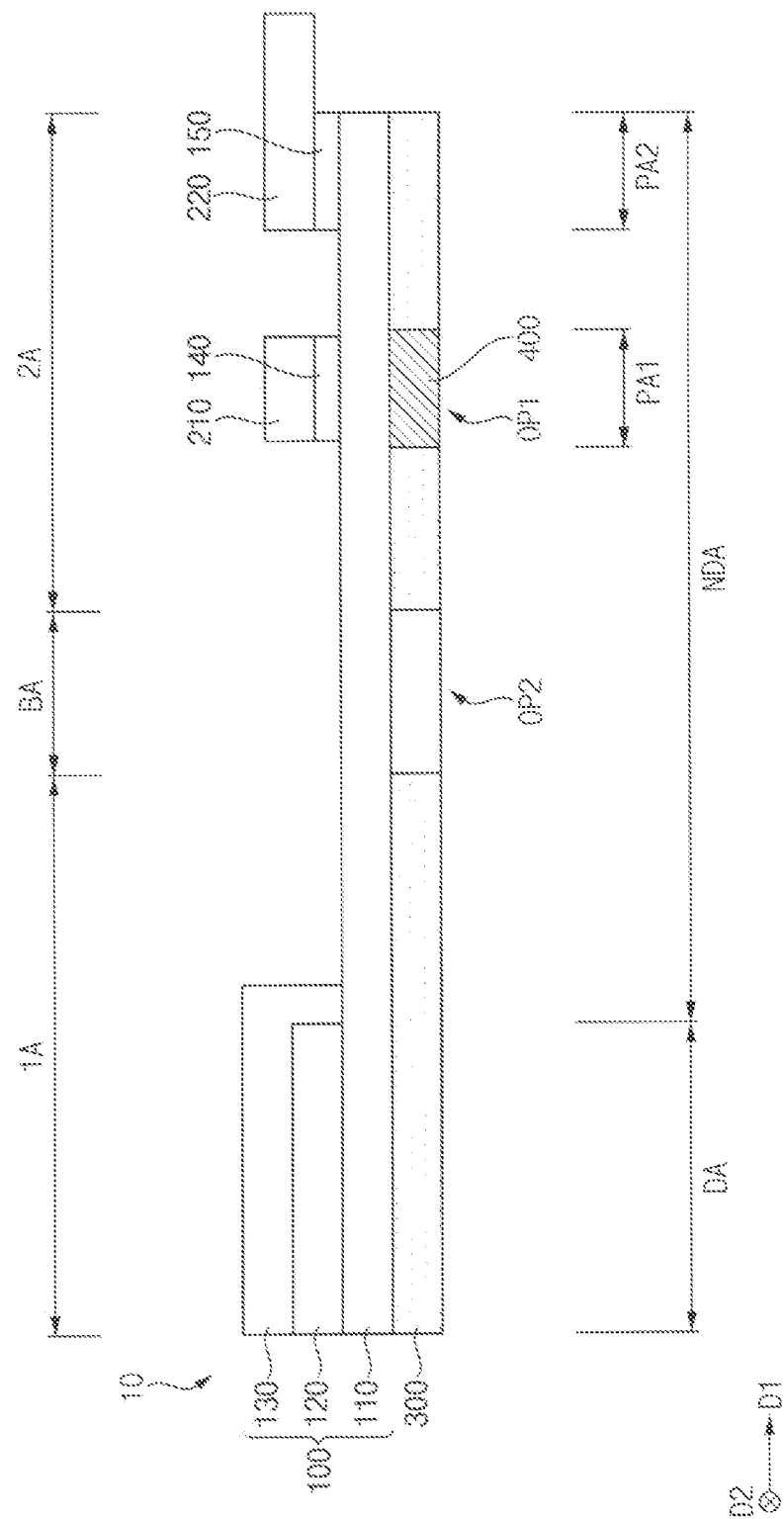

Referring to FIG. 11, the circuit board 220 may be bonded to the display panel 100 at the second pad area PA2.

The first end of the circuit board 220 may be positioned on the second pad part 150, and the circuit board 220 may be bonded to the display panel 100 at the second pad area PA2 by applying pressure (or, pressure and heat) to the first end of the circuit board 220, such as by using a compression head (not illustrated).

In an embodiment, the circuit board 220 may be bonded in the second pad area PA2 of the display panel 100 by an ACF bonding method. In an embodiment, for example, corresponding to a relatively wide pitch of bump electrodes of the circuit board 220, the circuit board 220 may be bonded by the ACF bonding method that is relatively easy to process. In an embodiment, when the bump electrodes of the circuit board 220 have a relatively narrow pitch (e.g., fine pitch), the circuit board 220 may be bonded by an ultrasonic bonding method similar to that described above for bonding of the driving circuit chip 210.

Figure 12:
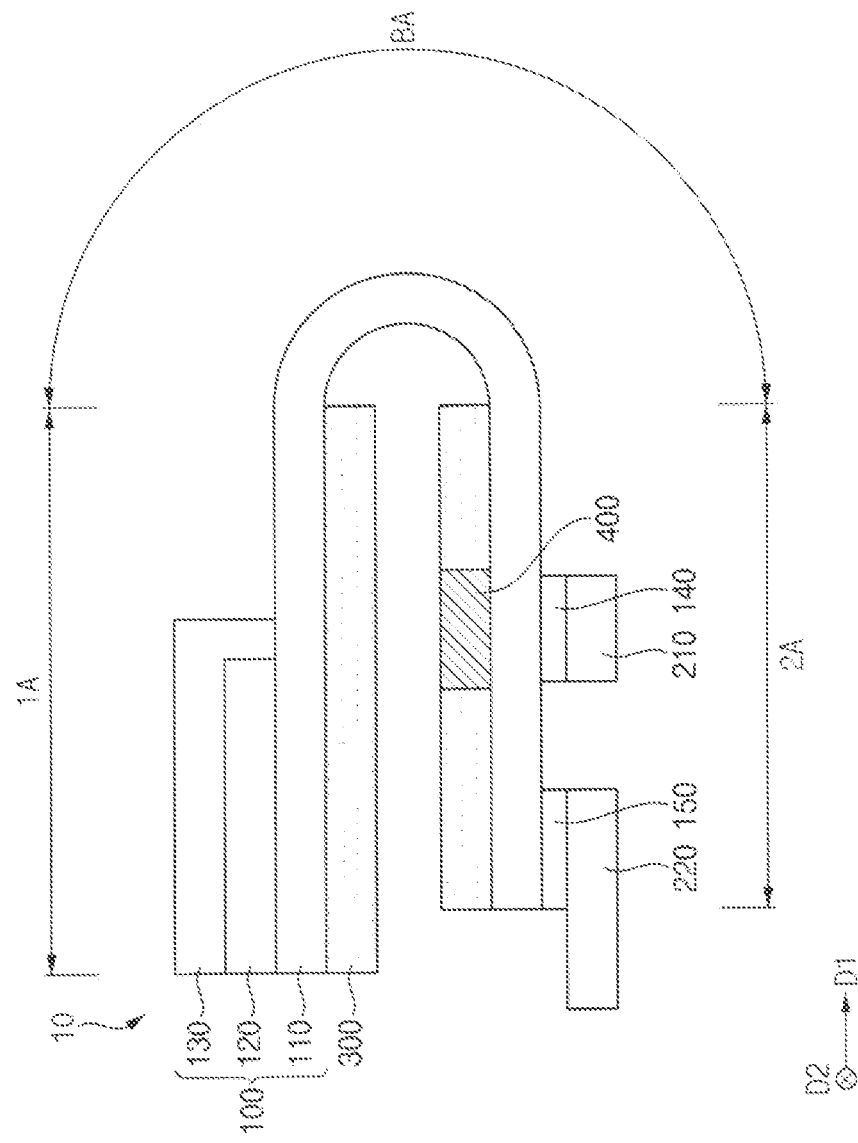

Referring to FIG. 12, the display panel 100 may be bent at the bending area BA. The display panel 100 may be bent at the bending area BA, along the bending axis, such that the second area 2A is positioned under the first area 1A and facing the first area 1A along the thickness direction. Accordingly, the second portion of the protective layer 300 and the support member 400 may face the first portion of the protective layer 300.

According to embodiments, the rigid support member 400 may be formed before the bonding process of the driving circuit chip 210. That is, the bonding process of the driving circuit chip 210 may be performed in a state in which the rigid support member 400 having a hardness which is higher than a hardness of the protective layer 300 supports the first pad area PA1 of the display panel 100. Accordingly, low-pressure bonding with a relatively low pressure may be possible. Accordingly, the reliability of the display device 10 may be improved. The protective layer 300 and the support member 400 may together provide a support layer facing components of the display panel 100 (e.g., a respective pad part, display part 120, etc.) with the substrate 110 therebetween. The support layer may include a support portion (e.g., support member 400) corresponding to the respective pad part which has a higher hardness (or rigidity) than that of a remaining portion of the support layer (e.g., portions of the protective layer 300). The support portion may be coplanar with the remaining portion of the support layer.

In addition, as the support member 400 covers the lower surface of the display panel 100 exposed by the first opening OP1 of the protective layer 300, defects caused by inflow of foreign substances into the display panel 100 may be prevented or reduced. Accordingly, the reliability of the display device 10 may be improved.

In addition, when the driving circuit chip 210 is bonded by the ultrasonic bonding method, ultrasonic energy may be sufficiently transmitted to the driving circuit chip 210 having the rigid support member 400 thereunder to effectively bond the driving circuit chip 210. Accordingly, the reliability of the display device 10 may be improved. Also, the stage having the substantially flat upper surface (e.g., having no protrusion 501b) can be used to perform the ultrasonic bonding process. Accordingly, the process of providing the display device 10 may be simplified and cost may be reduced.

Figure 13:
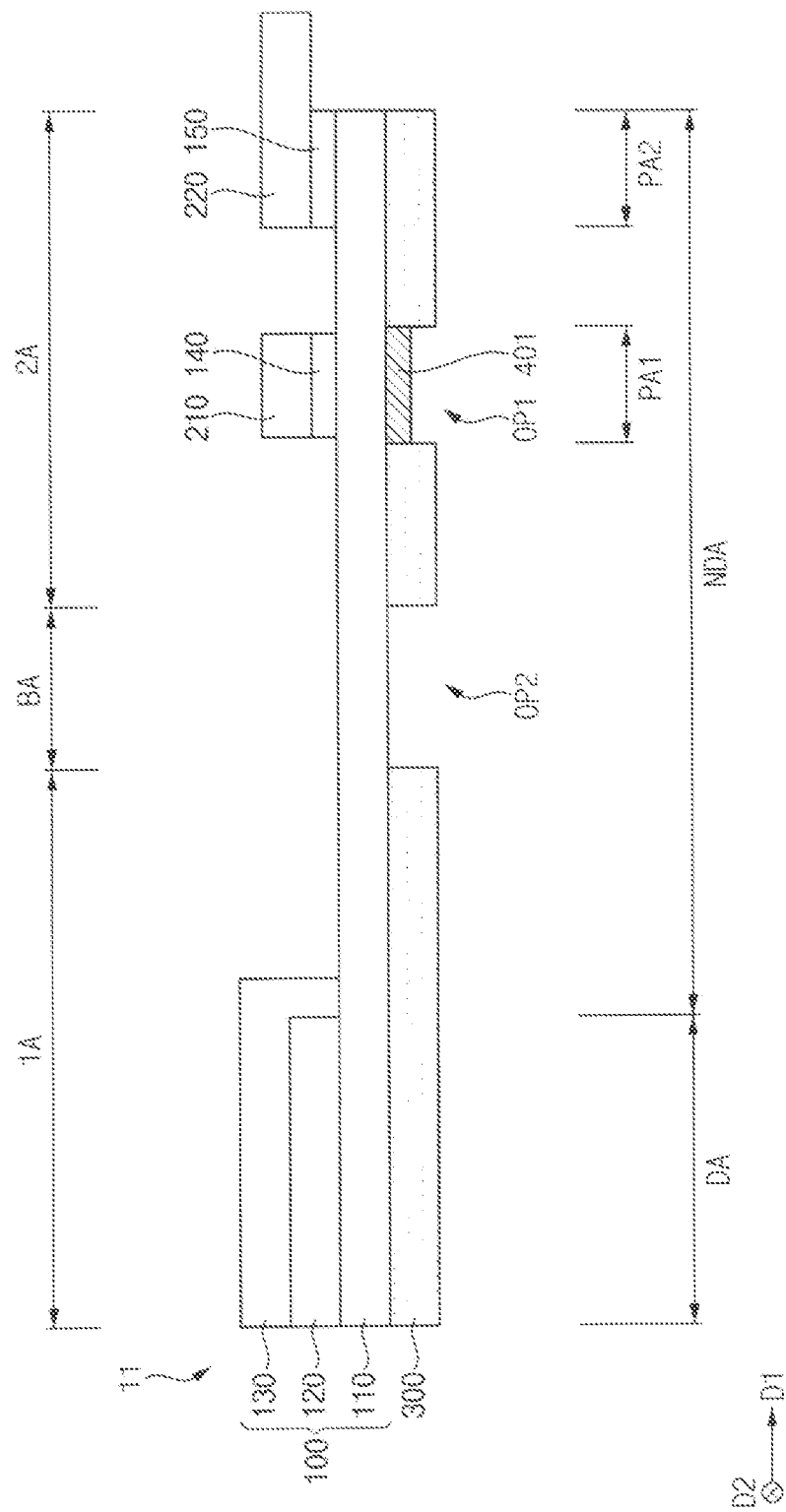
FIG. 13 is a cross-sectional view illustrating an embodiment of a display device.
Figure 14:
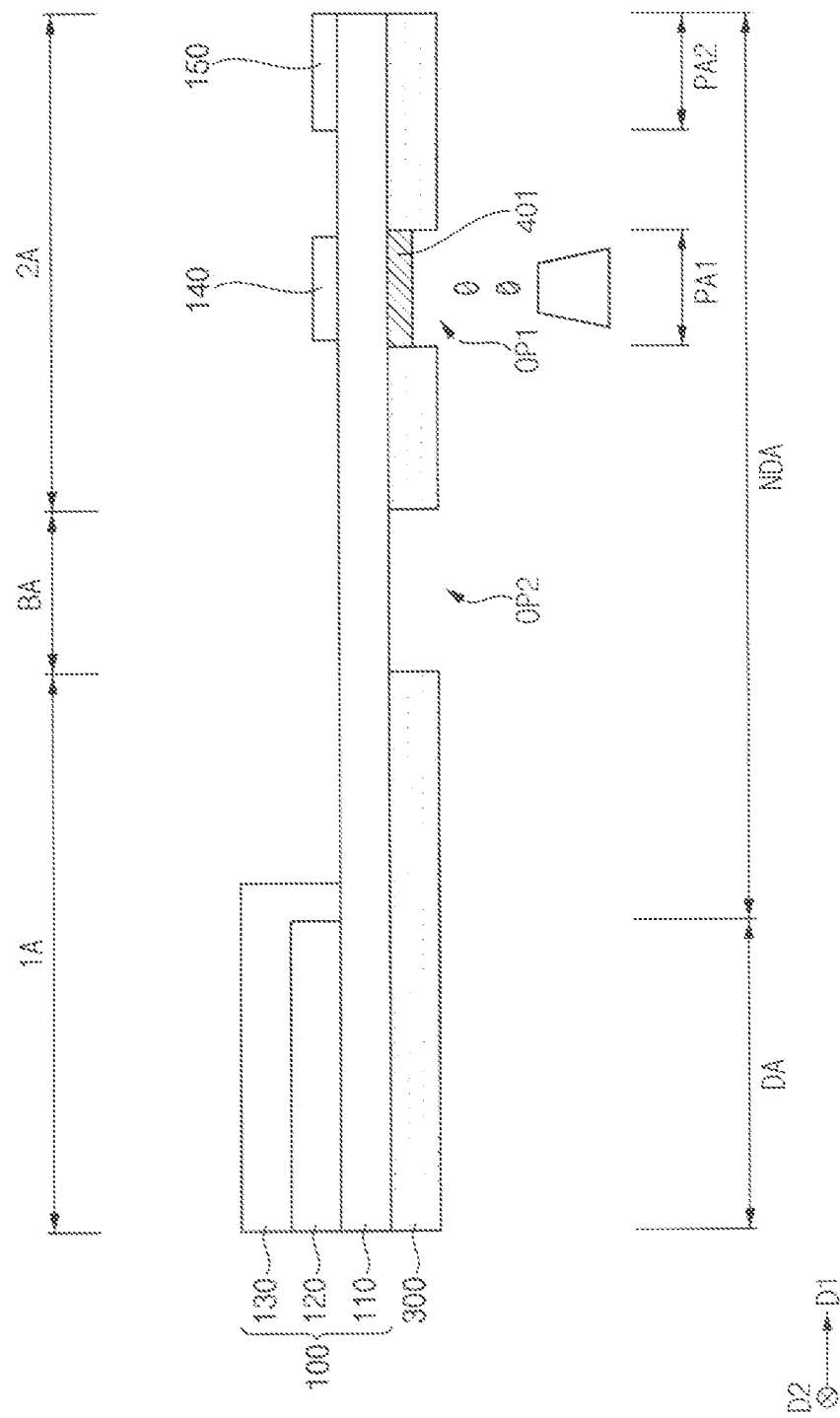
FIGS. 14 to 17 are cross-sectional views illustrating an embodiment of a method of providing the display device of FIG. 13.

FIG. 13 is a cross-sectional view illustrating an embodiment of a display device 11.

A display device 11 described with reference to FIG. 13 may be substantially the same as or similar to the display device 10 described with reference to FIGS. 1 to 7 except for a support member 401. Therefore, repeated descriptions will be omitted.

Referring to FIG. 13, the display device 11 may include the display panel 100, the driving circuit chip 210, the circuit board 220, the protective layer 300, and the support member 401.

The support member 401 may be disposed in the first opening OP1 of the protective layer 300. The support member 401 may include a rigid material and may have rigidity. In an embodiment, the support member 401 may include glass. The support member 401 may include silica glass. However, embodiments are not limited thereto, and the support member 401 may include another rigid material such as a metal, an alloy, or the like.

In an embodiment, a thickness of the support member 401 may be less than a depth of the first opening OP1 of the protective layer 300. That is, the support member 401 may partially fill the first opening OP1 of the protective layer 300. The thickness of the support member 401 may be less than a thickness of the protective layer 300. The support member 401 may form a recess corresponding to the first pad area PA1, together with the second portion of the protective layer 300.

FIGS. 14 to 17 are cross-sectional views illustrating embodiments of processes in a method of manufacturing (or providing) the display device 11 of FIG. 13.

Referring to FIG. 8, the protective layer 300 may be formed under the display panel 100 including the substrate 110, the display part 120, the encapsulation layer 130, the first pad part 140, and the second pad part 150. The protective layer 300 may be formed by the same method as the method described with reference to FIG. 8.

Subsequently, the rigid support member 401 may be formed in the first opening OP1 of the protective layer 300.

In an embodiment, the support member 401 may be formed in the first opening OP1 of the protective layer 300 by an inkjet method. In an embodiment, for example, the support member 401 may be formed by an inkjet method in a state in which the display panel 100 and the protective layer 300 are turned over such that a lower surface of the protective layer 300 faces upward, but the following description will be based on FIG. 14.

An ink composition including a liquid state rigid material may be provided into the first opening OP1 of the protective layer 300. In an embodiment, for example, the ink composition may include liquid glass, liquid metal paste, or the like.

In an embodiment, the ink composition may be provided into the first opening OP1 to partially fill the first opening OP1 of the protective layer 300. That is, a thickness of the ink composition provided into the first opening OP1 may be less than the depth of the first opening OP1. Subsequently, the ink composition may be cured to form the rigid support member 401. The thickness of the support member 401 may be less than the depth of the first opening OP1. That is, a lower portion of the first opening OP1 which is furthest from the substrate 110 may not be filled by the support member 401. A lower surface of the support member 401 may be closer to the substrate 110 than a lower surface of the protective layer 300, at the first pad area PA1. That is, the support layer including a support portion (e.g., support member 401) together with a remaining portion of the support layer (e.g., portions of the protective layer 300) may be recessed at the first pad area PA1.

In an embodiment, the support member 401 may include glass. The support member 401 may include silica glass. However, embodiments are not limited thereto, and the support member 401 may include another rigid material such as a metal, an alloy, or the like.

Figure 15:
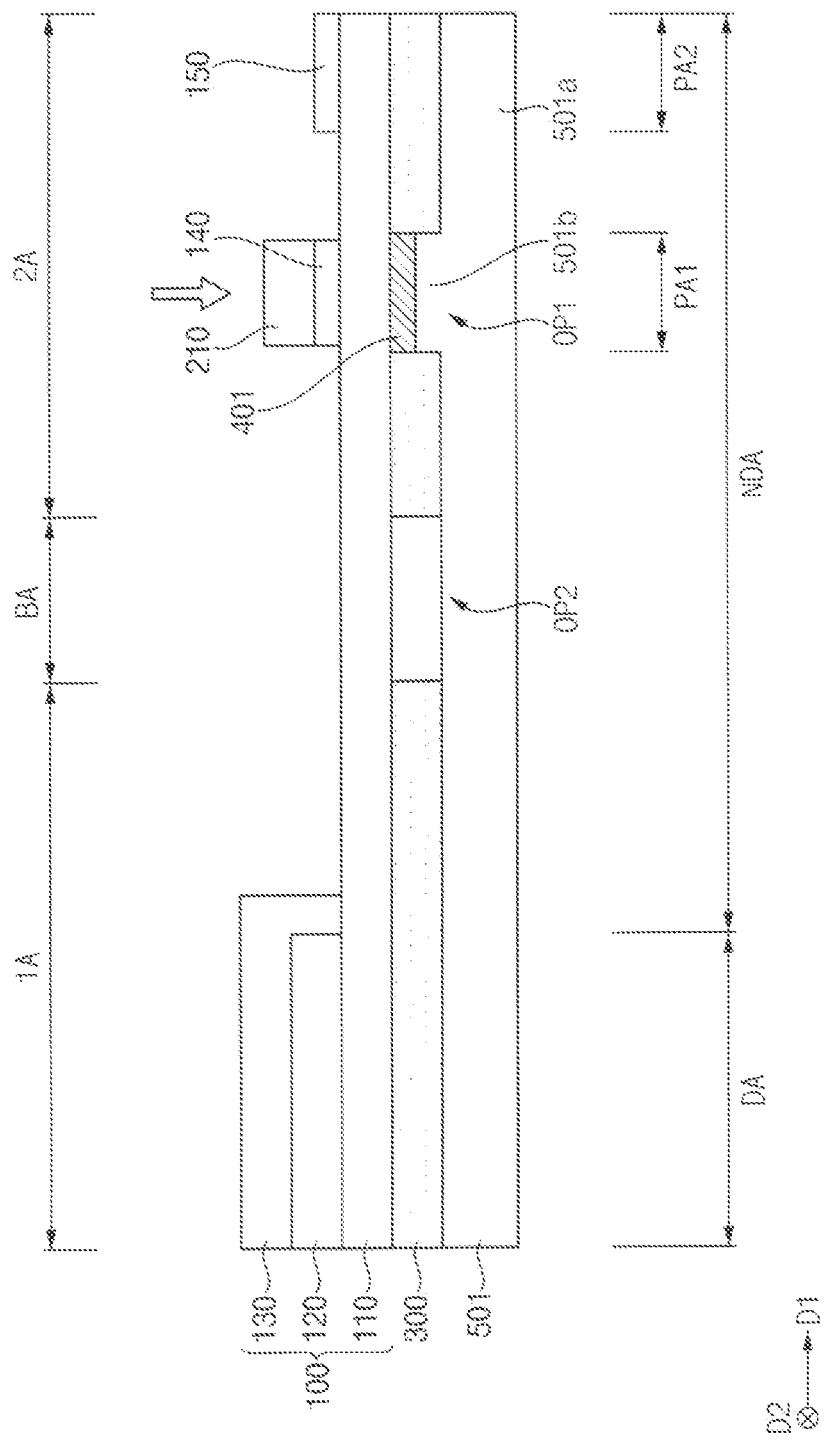

Referring to FIG. 15, the driving circuit chip 210 may be bonded in the first pad area PA1 on the display panel 100.

A rigid stage 501 may be positioned under the protective layer 300 and the support member 401.

In an embodiment, the rigid stage 501 may include a body 501a and a protrusion 501b which protrudes upward from the body 501a and toward the substrate 110. The protrusion 501b of the rigid stage 501 may have a shape corresponding to the first opening OP1 to be insertable into the first opening OP1 of the protective layer 300. The rigid stage 501 may be positioned under the protective layer 300 and the support member 401 such that the protrusion 501b is engaged with the protective layer 300 at the first opening OP1. An upper surface of the protrusion 501b of the rigid stage 501 (e.g., a distal end of the protrusion 501b) may contact a lower surface of the support member 401 which is spaced apart from a lower surface of the protective layer 300 along the thickness direction.

In an embodiment, for example, a sum of the thickness of the support member 401 and a thickness of the protrusion 501b of the rigid stage 501 may be substantially the same as the depth of the first opening OP1 of the protective layer 300. That is, when the protrusion 501b of the rigid stage 501 is inserted into the first opening OP1 of the protective layer 300 so that the upper surface of the protrusion 501b contacts the lower surface of the support member 401, an upper surface of the body 501a may contact the lower surface of the protective layer 300.

Subsequently, the driving circuit chip 210 may be positioned on the first pad part 140, and the driving circuit chip 210 may be bonded in the first pad area PA1 on the display panel 100 by applying pressure (or, pressure and heat) to an upper surface of the driving circuit chip 210 using a compression head (not illustrated). In an embodiment, the driving circuit chip 210 may be bonded in the first pad area PA1 on the display panel 100 by the ultrasonic bonding method. In an embodiment, the driving circuit chip 210 may be bonded in the first pad area PA1 on the display panel 100 by the ACF bonding method.

Figure 16:
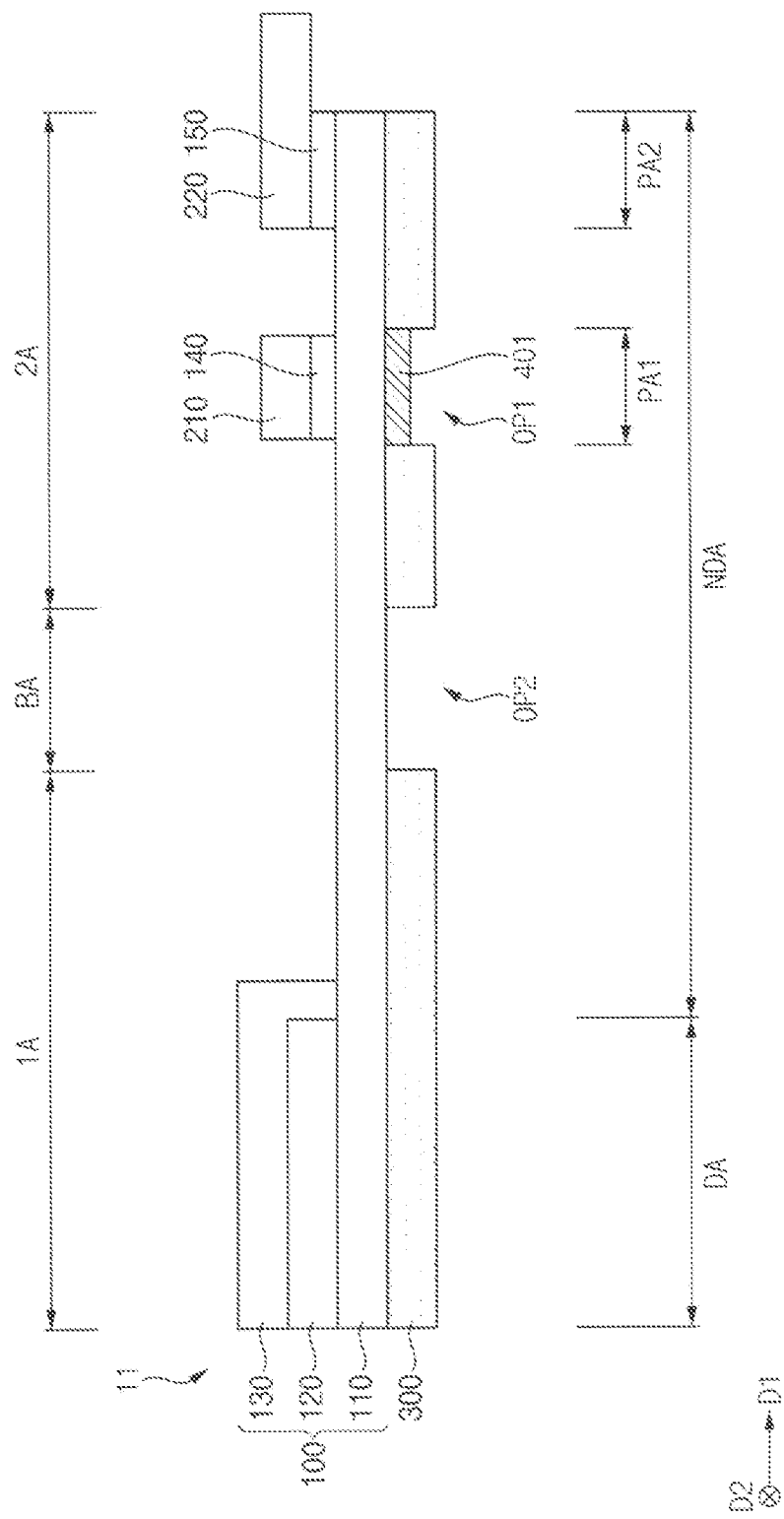

Referring to FIG. 16, the circuit board 220 may be bonded in the second pad area PA2 on the display panel 100.

The first end of the circuit board 220 may be positioned on the second pad part 150, and the circuit board 220 may be bonded in the second pad area PA2 on the display panel 100 by applying pressure (or, pressure and heat) to the first end of the circuit board 220 using a compression head (not illustrated).

Figure 17:
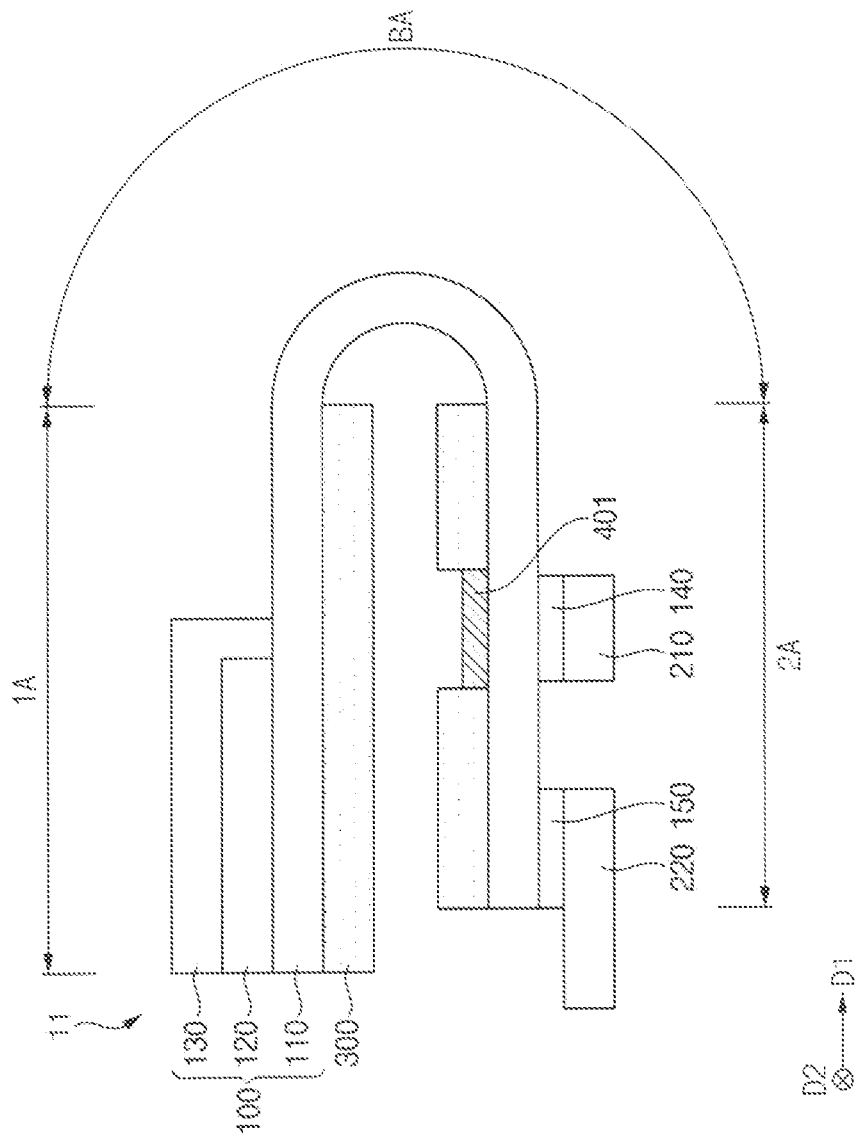

Referring to FIG. 17, the display panel 100 may be bent. The bending area BA of the display panel 100 may be bent along the bending axis such that the second area 2A is positioned under the first area 1A. Accordingly, the second portion of the protective layer 300 and the support member 401, may face the first portion of the protective layer 300.

According to embodiments, the rigid support member 401 may be formed to partially fill the first opening OP1 of the protective layer 300. Accordingly, an amount of the rigid material used to form the support member 401 may be reduced, so that cost may be reduced. In addition, it is possible to secure a process margin for thickness management of the support member 401.

In addition, the rigid support member 401 may be formed before the bonding process of the driving circuit chip 210. That is, the bonding process of the driving circuit chip 210 may be performed in a state in which the rigid support member 401 having a relatively high hardness than the protective layer 300 supports the first pad area PA1 of the display panel 100. Accordingly, low-pressure bonding with a relatively low pressure may be possible. Accordingly, the reliability of the display device 11 may be improved.

In addition, as the support member 401 covers the lower surface of the display panel 100 exposed by the first opening OP1 of the protective layer 300, it is possible to prevent or reduce defects caused by inflow of foreign substances into the display panel 100. Accordingly, the reliability of the display device 11 may be improved.

In addition, when the driving circuit chip 210 is bonded by the ultrasonic bonding method, ultrasonic energy may be sufficiently transmitted to the driving circuit chip 210 through support of the rigid support member 401 thereunder to effectively bond the driving circuit chip 210. Accordingly, the reliability of the display device 11 may be improved.

Figure 18:
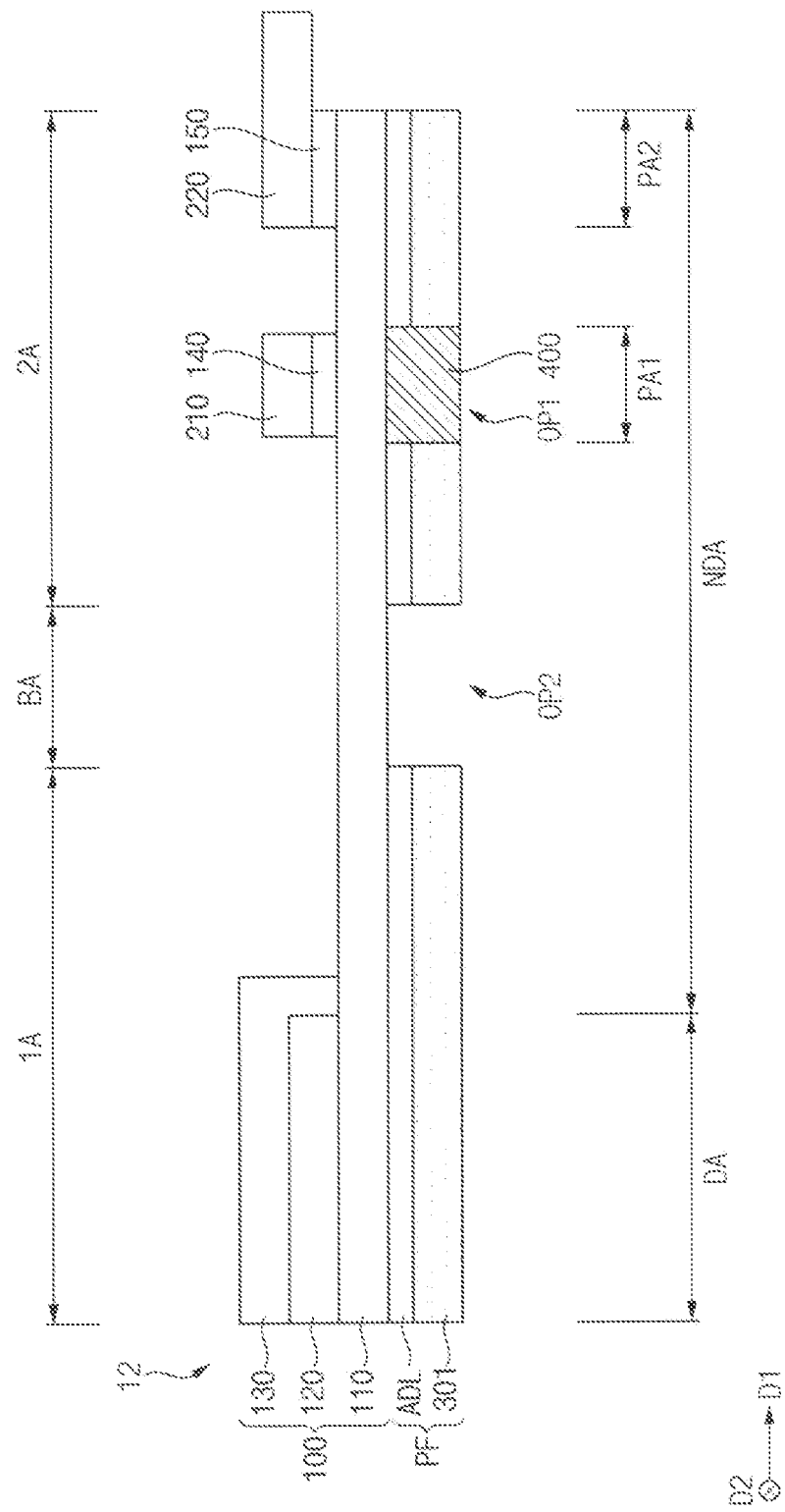
FIG. 18 is a cross-sectional view illustrating an embodiment of a display device.

FIG. 18 is a cross-sectional view illustrating an embodiment of a display device 12.

A display device 12 described with reference to FIG. 18 may be substantially the same as or similar to the display device 10 described with reference to FIGS. 1 to 7 except for a protective film PF. Therefore, repeated descriptions will be omitted.

Referring to FIG. 18, a display device 12 may include the display panel 100, the driving circuit chip 210, the circuit board 220, a protective film PF, and the support member 400.

The protective film PF may be attached under the display panel 100 to protect the display panel 100 from external impact. The protective film PF may include a protective layer 301 and an adhesive layer ADL.

In an embodiment, the protective layer 301 may include a flexible polymer material. Examples of the polymer material may include polyethylene terephthalate (PET), polyethylene naphthalene (PEN), polypropylene (PP), polycarbonate (PC), Polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), or the like, but embodiments are not limited thereto. These can be used alone or in a combination thereof.

The protective layer 301 may be attached under the substrate 110 by the adhesive layer ADL. That is, the protective layer 301 may be spaced apart from the substrate 110 with the adhesive layer ADL interposed therebetween. An upper surface of the adhesive layer ADL may contact a lower surface of the substrate 110, and a lower surface of the adhesive layer ADL may contact an upper surface of the protective layer 301. In an embodiment, for example, the adhesive layer ADL may include a pressure sensitive adhesive (PSA), an optical clear adhesive (OCA), an optical clear resin (OCR), or the like.

The protective film PF may define a first opening OP1 and a second opening OP2. In an embodiment, for example, each of the protective layer 301 and the adhesive layer ADL may define a portion of the first opening OP1 and a portion of the second opening OP2. That is, the protective layer 301 and the adhesive layer ADL may have substantially the same planar shape. In an embodiment, for example, each of the protective layer 301 and the adhesive layer ADL may be cut and attached under the substrate 110.

The support member 400 may be disposed in the first opening OP1 of the protective film PF. An upper surface of the support member 400 may contact the lower surface of the substrate 110. An outer surface of the support member 400 may contact an inner surface (e.g., sidewall) of the adhesive layer ADL defining the first opening OP1 and an inner surface (e.g., sidewall) of the protective layer 301 defining the first opening OP1.

In an embodiment, as illustrated in FIG. 18, a thickness of the support member 400 may be substantially the same as a depth of the first opening OP1 of the protective film PF. That is, the support member 400 may entirely fill the first opening OP1 of the protective film PF. The thickness of the support member 400 may be substantially the same as a sum of a thickness of the protective layer 301 and a thickness of the adhesive layer ADL.

In an embodiment, although not illustrated in the drawings, the thickness of the support member 400 may be less than the depth of the first opening OP1 of the protective film PF. That is, the support member 400 may partially fill the first opening OP1 of the protective film PF. The thickness of the support member 400 may be less than the sum of the thickness of the protective layer 301 and the thickness of the adhesive layer ADL.

Figure 19:
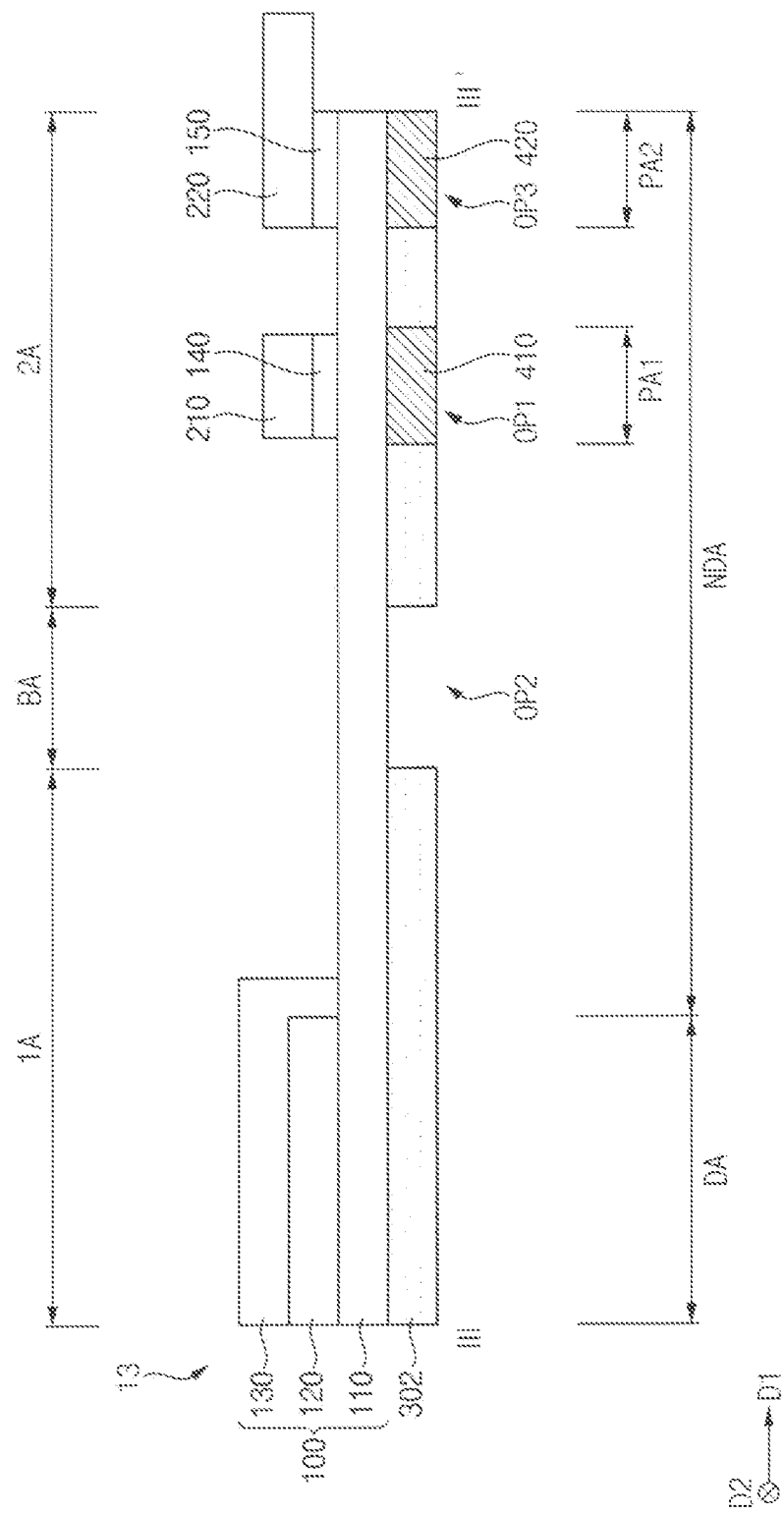
FIG. 19 is a cross-sectional view illustrating an embodiment of a display device.

FIG. 19 is a cross-sectional view illustrating an embodiment of a display device 13.

A display device 13 described with reference to FIG. 19 may be substantially the same as or similar to the display device 10 described with reference to FIGS. 1 to 7 except for a protective layer 302, a first support member 410, and a second support member 420. Therefore, repeated descriptions will be omitted.

Referring to FIG. 19, a display device 13 may include the display panel 100, the driving circuit chip 210, the circuit board 220, a protective layer 302, a first support member 410, and a second support member 420.

The protective layer 302 may define a first opening OP1, a second opening OP2, and a third opening OP3 (e.g., a plurality of openings). The first opening OP1 may overlap the first pad area PA1. The second opening OP2 may overlap the bending area BA. The third opening OP3 may overlap the second pad area PA2. That is, a plurality of openings may respectively correspond to a plurality of pad areas.

The first support member 410 may be disposed in the first opening OP1 of the protective layer 302. The second support member 420 may be disposed in the third opening OP3 of the protective layer 302.

Each of the first support member 410 and the second support member 420 may include a rigid material and may have rigidity. In an embodiment, the first support member 410 and the second support member 420 may include the same material. In an embodiment, for example, each of the first support member 410 and the second support member 420 may include glass. Each of the first support member 410 and the second support member 420 may include silica glass. However, embodiments are not limited thereto, and each of the first support member 410 and the second support member 420 may include another rigid material such as a metal, an alloy, or the like.

In an embodiment, the first support member 410 and the second support member 420 may be substantially simultaneously formed. In an embodiment, for example, the first support member 410 and the second support member 420 may be substantially simultaneously formed by jetting a liquid state rigid material (e.g., liquid glass) into the first opening OP1 and the third opening OP3 of the protective layer 302, respectively, using an inkjet method and curing the jetted material. The first support member 410 and the second support member 420 may be formed before the bonding process of the driving circuit chip 210 and the circuit board 220 to the display panel 100.

According to embodiments, the bonding process of the driving circuit chip 210 may be performed in a state in which the rigid first support member 410 supports the first pad area PA1 of the display panel 100, and the bonding process of the circuit board 220 may be performed in a state in which the rigid second support member 420 supports the second pad area PA2 of the display panel 100. Accordingly, low-pressure bonding with a relatively low pressure may be possible in the bonding process of the circuit board 220. In addition, the circuit board 220 may be bonded by the ultrasonic bonding method.

Figure 20:
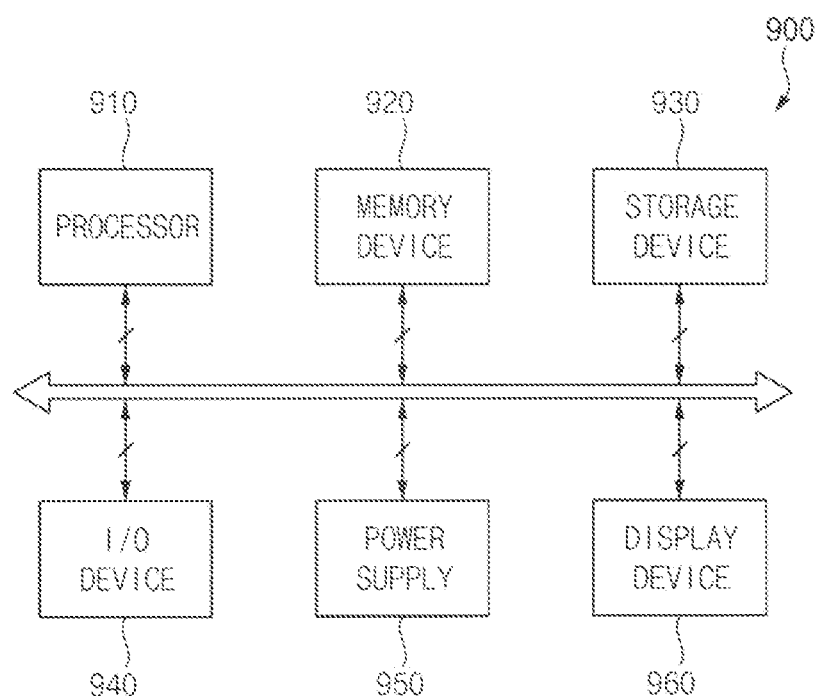
FIG. 20 is a block diagram illustrating an embodiment of an electronic device.

FIG. 20 is a block diagram illustrating an embodiment of an electronic device 900.

Referring to FIG. 20, in an embodiment, an electronic device 900 may include a processor 910, a memory device 920, a storage device 930, an input/output ("I/O") device 940, a power supply 950, and a display device 960. Here, the display device 960 may correspond to the display device 10 described with reference to FIGS. 1 to 7, the display device 11 described with reference to FIG. 13, the display device 12 described with reference to FIG. 18, or the display device 13 described with reference to FIG. 19. The electronic device 900 may further include a plurality of ports for communicating with a video card, a sound card, a memory card, a universal serial bus ("USB") device, or the like. In an embodiment, the electronic device 900 may be implemented as a television. In an embodiment, the electronic device 900 may be implemented as a smart phone. However, embodiments are not limited thereto, in an embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touchscreen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. An electronic device comprising:
 a substrate including a display area and a pad area which is adjacent to the display area;
 a display part on the substrate, in the display area of the substrate;

a driving circuit chip on the substrate, in the pad area of the substrate;

a protective layer which faces the display part with the substrate therebetween and in which a first opening is defined, the first opening in the protective layer overlapping the driving circuit chip; and a glass support member in the first opening of the protective layer and facing the driving circuit chip with the substrate therebetween.

2. The electronic device of claim 1, wherein the first opening of the protective layer has a depth, the glass support member has a thickness, and the thickness of the glass support member is the same as the depth of the first opening of the protective layer.

3. The electronic device of claim 1, wherein the first opening of the protective layer has a depth, the glass support member has a thickness, and the thickness of the glass support member is less than the depth of the first opening of the protective layer.

4. The electronic device of claim 1, wherein the protective layer includes a photocurable resin.

5. The electronic device of claim 1, wherein the protective layer is attached to the substrate by an adhesive layer.

6. The electronic device of claim 1, wherein the substrate further includes a bending area between the display area and the pad area, and a second opening is further defined in the protective layer, the second opening corresponding to the bending area.

7. An electronic device comprising:

a substrate including a display area and a pad area which is adjacent to the display area;

a display part on the substrate, in the display area of the substrate;

a driving circuit chip on the substrate, in the pad area of the substrate;

a protective layer which faces the display part with the substrate therebetween and in which a first opening is defined, the first opening in the protective layer overlapping the driving circuit chip and having a depth; and a support member in the first opening of the protective layer and facing the driving circuit chip with the substrate therebetween, the support member having a thickness which is less than the depth of the first opening of the protective layer, wherein each of the protective layer and the support member has a rigidity, and the rigidity of the support member facing the driving circuit chip is greater than the rigidity of the protective layer.

* * * * *